(12) United States Patent
Tomizawa et al.

(10) Patent No.: US 9,837,580 B2
(45) Date of Patent: Dec. 5, 2017

(54) SEMICONDUCTOR LIGHT EMITTING DEVICE

(71) Applicant: Kabushiki Kaisha Toshiba, Minato-ku (JP)

(72) Inventors: Hideyuki Tomizawa, Ishikawa-ken (JP); Akihiro Kojima, Ishikawa-ken (JP); Miyoko Shimada, Ishikawa-ken (JP); Yosuke Akimoto, Ishikawa-ken (JP); Miyuki Shimojuku, Kanagawa-ken (JP); Hideto Furuyama, Kanagawa-ken (JP); Yoshiaki Sugizaki, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,045

(22) Filed: Mar. 10, 2014

(65) Prior Publication Data
US 2015/0115300 A1   Apr. 30, 2015

(30) Foreign Application Priority Data

Oct. 28, 2013   (JP) .................................. 2013-223445

(51) Int. Cl.
*H01L 33/36*   (2010.01)
*H01L 33/38*   (2010.01)
(Continued)

(52) U.S. Cl.
CPC ............. *H01L 33/36* (2013.01); *H01L 33/38* (2013.01); *H01L 33/44* (2013.01); *H01L 33/50* (2013.01);
(Continued)

(58) Field of Classification Search
CPC ...................................................... H01L 33/38
See application file for complete search history.

(56) References Cited

U.S. PATENT DOCUMENTS 3,969,751 A * 7/1976 Drukaroff ......... H01L 31/02164
                                                  136/256
8,110,421 B2   2/2012 Sugizaki et al.
(Continued)

FOREIGN PATENT DOCUMENTS

EP   2 393 132 A2   12/2011
EP   2 393 132 A3   12/2011
(Continued)

OTHER PUBLICATIONS

Office Action dated Nov. 30, 2016, in Japanese Patent Application No. 2013-223445, filed Oct. 28, 2013, with English-language Translation.
(Continued)

*Primary Examiner* — Cuong Q Nguyen
*Assistant Examiner* — Nishath Yasmeen
(74) *Attorney, Agent, or Firm* — Oblon, McClelland, Maier & Neustadt, L.L.P.

(57) ABSTRACT

According to one embodiment, the n-side electrode has a corner and a plurality of straight portions. The plurality of straight portions extends in different directions. The corner connects the plurality of straight portions. A first insulating film is provided between the semiconductor layer and the corner of the n-side electrode. The corner is not in contact with the semiconductor layer. The straight portions of the n-side electrode are in contact with the semiconductor layer.

9 Claims, 21 Drawing Sheets

(51) Int. Cl.
  *H01L 33/44* (2010.01)
  *H01L 33/50* (2010.01)
  *H01L 33/14* (2010.01)
  *H01L 33/20* (2010.01)
  *H01L 33/46* (2010.01)
  *H01L 33/48* (2010.01)
  *H01L 33/00* (2010.01)

(52) U.S. Cl.
  CPC .......... *H01L 33/0079* (2013.01); *H01L 33/14* (2013.01); *H01L 33/20* (2013.01); *H01L 33/46* (2013.01); *H01L 33/486* (2013.01); *H01L 33/505* (2013.01); *H01L 2933/0016* (2013.01)

(56) References Cited

U.S. PATENT DOCUMENTS

| | | | |
|---|---|---|---|
| 2005/0056855 A1* | 3/2005 | Lin | H01L 33/382 257/98 |
| 2007/0034855 A1 | 2/2007 | Hwang et al. | |
| 2008/0096297 A1 | 4/2008 | Schiaffino et al. | |
| 2009/0261358 A1* | 10/2009 | Chitnis | H01L 33/0095 257/88 |
| 2010/0276725 A1 | 11/2010 | Hwang et al. | |
| 2011/0114986 A1* | 5/2011 | Kojima | H01L 33/405 257/99 |
| 2011/0297997 A1* | 12/2011 | Izuka | H01L 33/38 257/99 |
| 2012/0037946 A1 | 2/2012 | Yu et al. | |
| 2012/0049219 A1 | 3/2012 | Kamiya et al. | |
| 2012/0097972 A1 | 4/2012 | Sugizaki et al. | |
| 2012/0261695 A1* | 10/2012 | Chen | H01L 33/38 257/98 |
| 2014/0183586 A1 | 7/2014 | Kamiya et al. | |

FOREIGN PATENT DOCUMENTS

| | | |
|---|---|---|
| EP | 2 418 699 A2 | 2/2012 |
| JP | 2000-244012 | 9/2000 |
| JP | 2010-507246 | 3/2010 |
| JP | 2011-071272 | 4/2011 |
| JP | 2011-258670 | 12/2011 |
| JP | 2012-049366 | 3/2012 |

OTHER PUBLICATIONS

Office Action dated Nov. 26, 2015, in Taiwanese Patent Application No. 103104256, with English-language Translation.
Extended European Search Report dated Mar. 27, 2015 in Patent Application No. 14158534.9.

* cited by examiner

SEMICONDUCTOR LIGHT EMITTING DEVICE

CROSS-REFERENCE TO RELATED APPLICATION

This application is based upon and claims the benefit of priority from Japanese Patent Application No. 2013-223445, filed on Oct. 28, 2013; the entire contents of which are incorporated herein by reference.

FIELD

Embodiments described herein relate generally to a semiconductor light emitting device.

BACKGROUND

In a structure in which a p-side electrode and an n-side electrode are formed on one surface side of a semiconductor layer including a light emitting layer, the degrees of freedom of the configuration and layout of the electrodes is high because the electrodes do not impede the extraction of the light from the light emitting surface. Because the configuration and layout of the electrodes affect the electrical characteristics and the luminous efficiency, an appropriate design is desirable.

DETAILED DESCRIPTION

Figure 1:
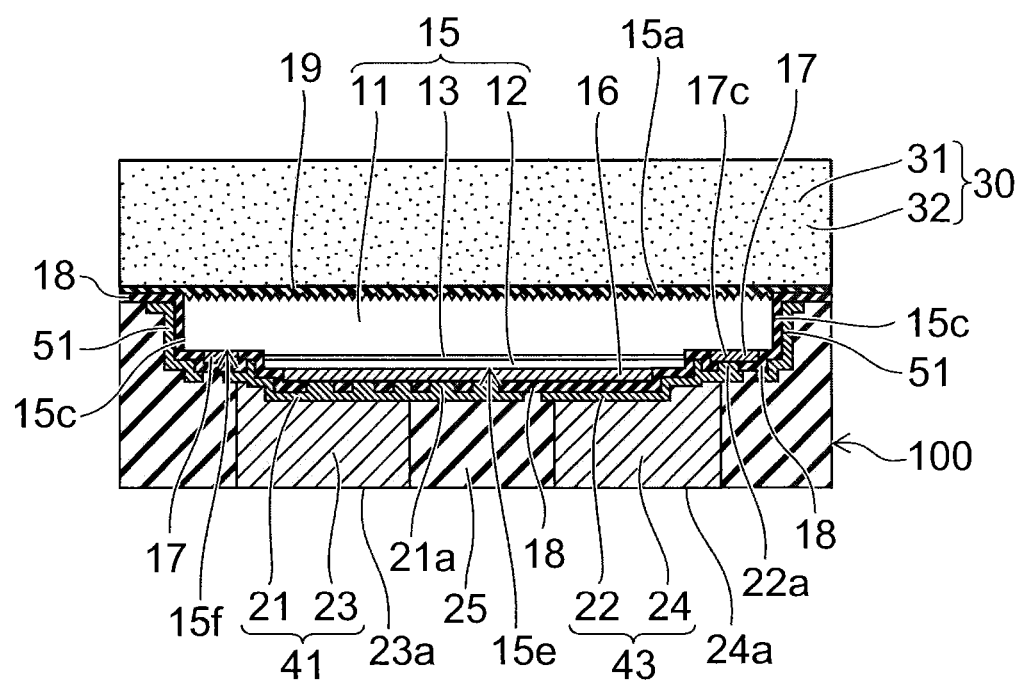
FIG. 1 is a schematic cross-sectional view of a semiconductor light emitting device of an embodiment.

According to one embodiment, a semiconductor light emitting device includes a semiconductor layer, a p-side electrode, an n-side electrode, a p-side interconnect unit, an n-side interconnect unit, and a resin layer. The semiconductor layer includes a light emitting layer. The semiconductor layer has a first surface and a second surface opposite to the first surface. The p-side electrode is provided on the semiconductor layer. The n-side electrode is provided on the semiconductor layer. The n-side electrode has a corner and a plurality of straight portions. The plurality of straight portions extends in different directions. The corner connects the plurality of straight portions. The p-side interconnect unit is provided on the second surface side to be connected to the p-side electrode. The n-side interconnect unit is provided on the second surface side to be connected to the n-side electrode. The resin layer is provided between the p-side interconnect unit and the n-side interconnect unit. A first insulating film is provided between the semiconductor layer and the corner of the n-side electrode. The corner is not in contact with the semiconductor layer. The straight portions of the n-side electrode are in contact with the semiconductor layer.

Embodiments will now be described with reference to the drawings. Similar components in the drawings are marked with like reference numerals.

FIG. 1 is a schematic cross-sectional view of a semiconductor light emitting device of an embodiment.

Figure 2A:
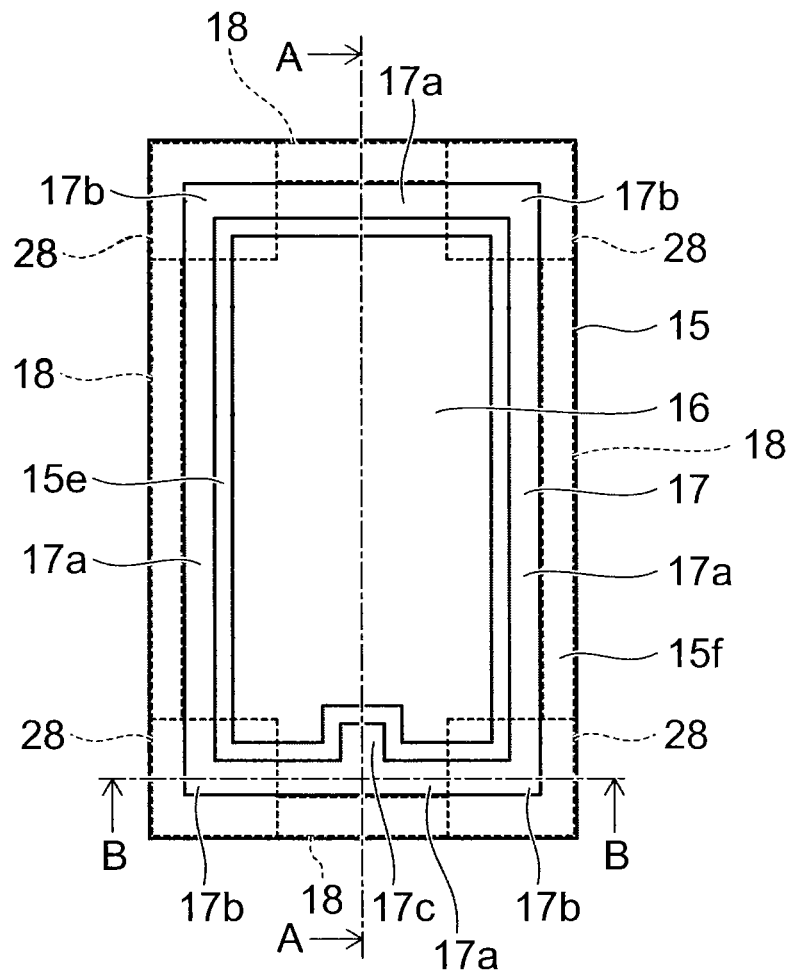
FIG. 2A is a schematic plan view of the semiconductor light emitting device of the embodiment.

FIG. 2A is a schematic plan view showing an example of the planar layout of a p-side electrode 16 and an n-side electrode 17 of the semiconductor light emitting device of the embodiment. FIG. 1 corresponds to the A-A cross section of FIG. 2A.

Figure 2B:
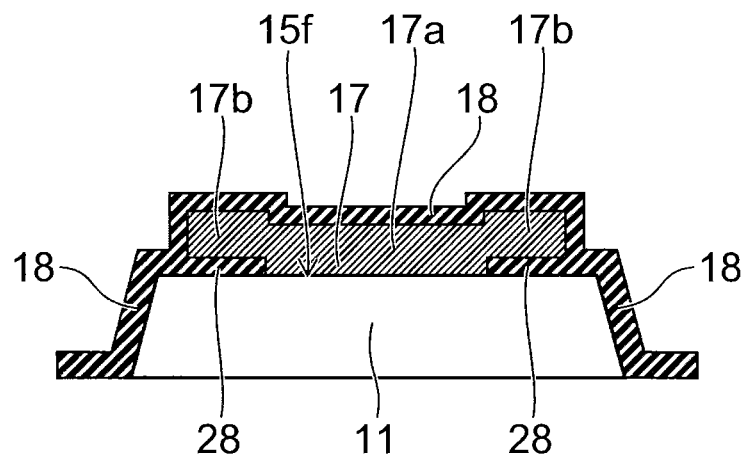
FIG. 2B is a B-B cross-sectional view of FIG. 2A.

FIG. 2B is a B-B cross-sectional view of FIG. 2A.

The semiconductor light emitting device of the embodiment includes a semiconductor layer 15 that includes a light emitting layer 13. The semiconductor layer 15 has a first surface 15a, and a second surface 15b (referring to FIG. 7A) on the side opposite to the first surface 15a.

Figure 8A:
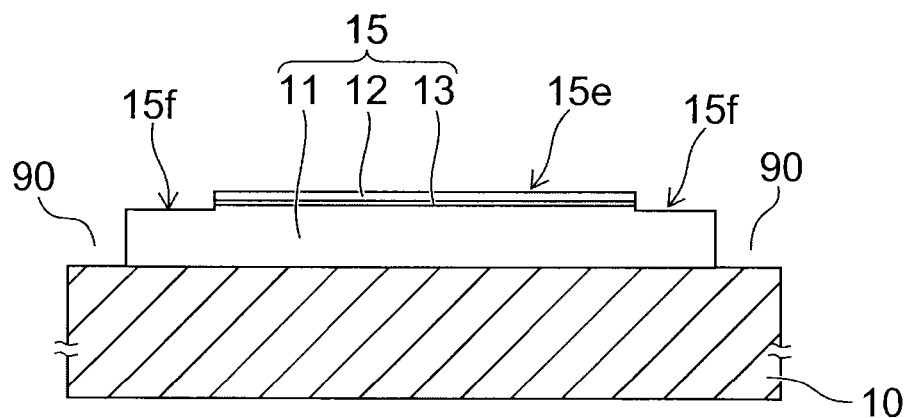

As shown in FIG. 8A, the second surface 15b of the semiconductor layer 15 has a portion (a light emitting region) 15e including the light emitting layer 13, and a portion (a non-light emitting region) 15f not including the light emitting layer 13. The portion 15e including the light emitting layer 13 is the portion of the semiconductor layer 15 in which the light emitting layer 13 is stacked. The portion 15f not including the light emitting layer 13 is the portion of the semiconductor layer 15 in which the light emitting layer 13 is not stacked. The portion 15e including the light emitting layer 13 is the region that has the stacked structure capable of extracting the light emitted by the light emitting layer 13 to the outside.

On the second surface side, the p-side electrode 16 is provided on the portion 15e including the light emitting layer 13; and the n-side electrode 17 is provided on the portion 15f not including the light emitting layer.

In the example shown in FIG. 2A, the portion 15f not including the light emitting layer 13 is provided around the portion 15e including the light emitting layer 13; and the n-side electrode 17 is provided around the p-side electrode 16.

The light emitting layer 13 emits light by a current being supplied to the light emitting layer 13 via the p-side electrode 16 and the n-side electrode 17. Then, the light that is radiated from the light emitting layer 13 is emitted outside the semiconductor light emitting device from the first surface 15a side.

As shown in FIG. 1, a support body 100 is provided on the second surface side of the semiconductor layer 15. A light emitting element that includes the semiconductor layer 15, the p-side electrode 16, and the n-side electrode 17 is supported by the support body 100 provided on the second surface side.

A fluorescer layer 30 is provided on the first surface 15a side of the semiconductor layer 15 as an optical layer that provides the desired optical characteristics to the light emitted by the semiconductor light emitting device. The fluorescer layer 30 includes fluorescers 31 having multiple particle configurations. The fluorescers 31 are excited by the light radiated by the light emitting layer 13 to radiate light of a wavelength different from that of the light radiated by the light emitting layer 13.

The multiple fluorescers 31 are combined in a single body by a binder 32. The binder 32 transmits the light radiated by the light emitting layer 13 and the light radiated by the fluorescers 31. Herein, "transmitting" is not limited to the transmittance being 100% and includes the case where a portion of the light is absorbed.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 include, for example, gallium nitride.

The first semiconductor layer 11 includes, for example, a foundation buffer layer and an n-type GaN layer. The second semiconductor layer 12 includes, for example, a p-type GaN layer. The light emitting layer 13 includes a material that emits blue light, violet light, bluish-violet light, ultraviolet light, etc. The light emission peak wavelength of the light emitting layer 13 is, for example, 430 to 470 nm.

The second surface of the semiconductor layer 15 is patterned into an uneven configuration. The protruding portion of the uneven configuration is the portion 15e including the light emitting layer 13; and the recessed portion of the uneven configuration is the portion 15f not including the light emitting layer 13. The surface of the portion 15e including the light emitting layer 13 is the surface of the second semiconductor layer 12; and the p-side electrode 16 is provided on the surface of the second semiconductor layer 12. The surface of the portion 15f not including the light emitting layer 13 is the surface of the first semiconductor layer 11; and the n-side electrode 17 is provided on the surface of the first semiconductor layer 11.

At the second surface of the semiconductor layer 15, the surface area of the portion 15e including the light emitting layer 13 is greater than the surface area of the portion 15f not including the light emitting layer 13. Also, the surface area of the p-side electrode 16 provided on the surface of the portion 15e including the light emitting layer 13 is greater than the surface area of the n-side electrode 17 provided on the surface of the portion 15f not including the light emitting layer 13. Thereby, a wide light emitting surface is obtained; and the light output can be high.

As shown in FIG. 2A, the n-side electrode 17 is formed in a configuration in which multiple straight portions 17a that extend in different directions are connected as one link via corners 17b on the second surface. In the example shown in FIG. 2A, for example, the outline of a rectangle is formed in which four straight portions 17a are connected via four corners 17b. The corners 17b may have curvature.

Also, a contact portion 17c is provided in one of the multiple straight portions 17a of the n-side electrode 17 to protrude in the width direction of the straight portion 17a. In other words, a portion of the straight portion 17a is wide. A via 22a for an n-side interconnect layer 22 that is described below is connected to the surface of the contact portion 17c.

The p-side electrode 16 contacts the surface of the second semiconductor layer 12 over the entire surface of the p-side electrode 16. On the other hand, the n-side electrode has a portion that contacts the surface of the first semiconductor layer 11, and a portion that does not contact the surface of the first semiconductor layer 11.

As shown in FIG. 2B, an insulating film 28 is provided between the surface of the first semiconductor layer 11 and the corners 17b of the n-side electrode 17. The insulating film 28 is, for example, an inorganic insulating film such as a silicon oxide film, etc. In FIG. 2A, the insulating film 28 that is between the surface of the first semiconductor layer 11 and the corners 17b of the n-side electrode 17 is illustrated by broken lines.

In other words, the corners 17b of the n-side electrode 17 do not contact the first semiconductor layer 11. As shown in FIG. 2B, the straight portions 17a that are between the corners 17b contact the surface of the first semiconductor layer 11. In the example shown in FIG. 2A, the contact portion 17c for the n-side interconnect layer 22 contacts the surface of the first semiconductor layer 11.

The straight portions 17a, the corners 17b, and the contact portion 17c form one continuous link. Therefore, it is unnecessary to connect each of separate n-side electrodes 17 to the n-side interconnect layer 22; and there may be one contact portion 17c between the n-side electrode 17 and the n-side interconnect layer 22.

Here, as a comparative example, the n-side electrode 17 has a configuration in which the straight portions 17a and the corners 17b are combined, and the entire surface of the n-side electrode 17 contacts the surface of the first semiconductor layer 11; and such a structure has a tendency for the current to concentrate at the corners 17b. The imbalance of the current distribution may cause an imbalance of the light emission intensity distribution and cause the efficiency, the heat dissipation, and the life to decrease.

Conversely, according to the embodiment, the insulating film 28 is provided between the first semiconductor layer 11 and the corners 17b of the n-side electrode 17; and the corners 17b do not contact the first semiconductor layer 11. Accordingly, the current does not flow directly in the stacking direction of the electrode and the semiconductor layer between the first semiconductor layer 11 and the corners 17b.

Therefore, the current concentration at the corners 17b can be relaxed; and the light emission intensity distribution can be uniform. Thereby, the luminous efficiency and the reliability can be increased.

As shown in FIG. 1, the second surface of the semiconductor layer 15, the p-side electrode 16, and the n-side electrode 17 are covered with an insulating film 18. The insulating film 18 is, for example, an inorganic insulating film such as a silicon oxide film, etc. The insulating film 18 is provided also on the side surface of the light emitting layer 13 and the side surface of the second semiconductor layer 12 to cover these side surfaces.

The insulating film 18 is provided also on a side surface 15c of the semiconductor layer 15 (the side surface of the first semiconductor layer 11) continuing from the first surface 15a to cover the side surface 15c.

The insulating film 18 is provided also in the region around the side surface 15c of the semiconductor layer 15. The insulating film 18 that is provided in the region around the side surface 15c at the first surface 15a side extends away from the side surface 15c.

A p-side interconnect layer 21 and the n-side interconnect layer 22 are provided on the insulating film 18 to be separated from each other. As shown in FIG. 9B, multiple first openings 18a that communicate with the p-side electrode 16 and a second opening 18b that communicates with the contact portion 17c of the n-side electrode 17 are made in the insulating film 18. The first openings 18a may be one large opening.

The p-side interconnect layer 21 is provided on the insulating film 18 and in the interiors of the first openings 18a. The p-side interconnect layer 21 is electrically connected to the p-side electrode 16 by vias 21a provided inside the first openings 18a.

The n-side interconnect layer 22 is provided on the insulating film 18 and in the interior of the second opening 18b. The n-side interconnect layer 22 is electrically connected to the contact portion 17c of the n-side electrode 17 by the via 22a provided inside the second opening 18b.

The p-side interconnect layer 21 and the n-side interconnect layer 22 are provided on the insulating film 18 to occupy the greater part of the region on the second surface side. The p-side interconnect layer 21 is connected to the p-side electrode 16 by the multiple vias 21a.

A metal film 51 covers the side surface 15c of the semiconductor layer 15 with the insulating film 18 interposed. The metal film 51 does not contact the side surface 15c and is not electrically connected to the semiconductor layer 15. The metal film 51 is separated from the p-side interconnect layer 21 and the n-side interconnect layer 22. The metal film 51 is reflective to the light radiated by the light emitting layer 13 and the light radiated by the fluorescers 31.

The metal film 51, the p-side interconnect layer 21, and the n-side interconnect layer 22 include copper films formed simultaneously by, for example, plating on a common foundation metal film.

Figure 10A:
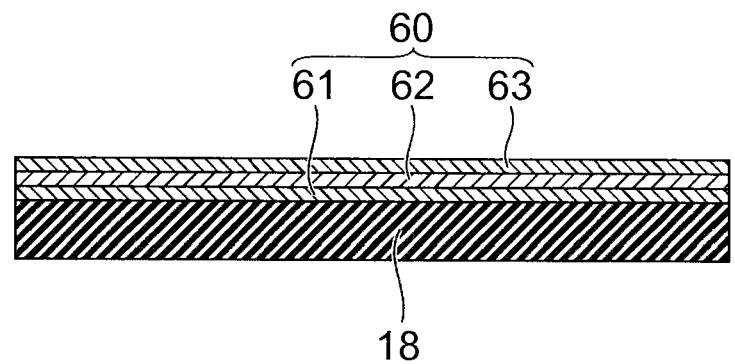

FIG. 10A is a schematic cross-sectional view of a foundation metal film 60.

For example, the copper films of the metal film 51, the p-side interconnect layer 21, and the n-side interconnect layer 22 are formed by plating on the foundation metal film 60 formed on the insulating film 18. Or, the metal film 51, the p-side interconnect layer 21, and the n-side interconnect layer 22 include the foundation metal film 60.

The foundation metal film 60 includes an aluminum (Al) film 61, a titanium (Ti) film 62, and a copper (Cu) film 63 stacked in order from the insulating film 18 side.

The aluminum film 61 functions as a reflective film; and the copper film 63 functions as a seed layer of the plating. The titanium film 62, which has excellent wettability for both aluminum and copper, functions as an adhesion layer.

For example, the thickness of the foundation metal film 60 is about 1 μm; and the thicknesses of the metal film 51, the p-side interconnect layer 21, and the n-side interconnect layer 22 are several μm.

Also, the metal film 51 may be a film made of the foundation metal film 60 without forming the plating film (the copper film) on the foundation metal film 60 in the region around the side surface 15c of the semiconductor layer 15. The metal film 51 has high reflectance for the light radiated by the light emitting layer 13 and the light radiated by the fluorescers 31 by the metal film 51 including at least the aluminum film 61.

Because the aluminum film 61 also remains under the p-side interconnect layer 21 and the n-side interconnect layer 22, the aluminum film (the reflective film) 61 is formed over the greater part of the region on the second surface side. Thereby, the amount of the light traveling toward the fluorescer layer 30 side can be increased.

A p-type metal pillar 23 is provided on the surface of the p-side interconnect layer 21 on the side opposite to the semiconductor layer 15. A p-side interconnect unit 41 is formed of the p-side interconnect layer 21 and the p-type metal pillar 23.

An n-side metal pillar 24 is provided on the surface of the n-side interconnect layer 22 on the side opposite to the semiconductor layer 15. An n-side interconnect unit 43 is formed of the n-side interconnect layer 22 and the n-side metal pillar 24.

A resin layer 25 is provided as an insulating film between the p-side interconnect unit 41 and the n-side interconnect unit 43. The resin layer 25 is provided between the p-type metal pillar 23 and the n-side metal pillar 24 to contact the side surface of the p-type metal pillar 23 and the side surface of the n-side metal pillar 24. In other words, the resin layer 25 is filled between the p-type metal pillar 23 and the n-side metal pillar 24.

The resin layer 25 is provided between the p-side interconnect layer 21 and the n-side interconnect layer 22, between the p-side interconnect layer 21 and the metal film 51, and between the n-side interconnect layer 22 and the metal film 51.

The resin layer 25 is provided around the p-type metal pillar 23 and around the n-side metal pillar 24 to cover the side surface of the p-type metal pillar 23 and the side surface of the n-side metal pillar 24.

The resin layer 25 is provided also in the region around the side surface 15c of the semiconductor layer 15 to cover the metal film 51.

The end portion (the surface) of the p-type metal pillar 23 on the side opposite to the p-side interconnect layer 21 is exposed from the resin layer 25 to function as a p-side external terminal 23a that is connectable to an external circuit such as a mounting substrate, etc. The end portion (the surface) of the n-side metal pillar 24 on the side opposite to the n-side interconnect layer 22 is exposed from the resin layer 25 to function as an n-side external terminal 24a that is connectable to the external circuit such as the mounting substrate, etc. The p-side external terminal 23a and the n-side external terminal 24a are bonded to a land pattern of the mounting substrate via, for example, solder or a bonding agent that is conductive.

The p-side external terminal 23a and the n-side external terminal 24a are formed to be arranged in the same surface (in FIG. 1, the lower surface) of the resin layer 25 to be separated from each other. The spacing between the p-side external terminal 23a and the n-side external terminal 24a is wider than the spacing between the p-side interconnect layer 21 and the n-side interconnect layer 22 on the insulating film 18. The spacing between the p-side external terminal 23a and the n-side external terminal 24a is set to be larger than the spread of the solder in the mounting. Thereby, shorts between the p-side external terminal 23a and the n-side external terminal 24a via the solder can be prevented.

Conversely, the spacing between the p-side interconnect layer 21 and the n-side interconnect layer 22 can be reduced to the process limits. Therefore, the surface area of the p-side interconnect layer 21 and the contact surface area between the p-side interconnect layer 21 and the p-type metal pillar 23 can be increased. Thereby, dissipation of the heat of the light emitting layer 13 can be promoted.

The surface area of the p-side interconnect layer 21 contacting the p-side electrode 16 by the multiple vias 21a is greater than the surface area of the n-side interconnect layer 22 contacting the n-side electrode 17 by the via 22a. Thereby, the distribution of the current flowing in the light emitting layer 13 can be made uniform.

The surface area of the n-side interconnect layer 22 on the insulating film 18 can be greater than the surface area of the n-side electrode 17. Then, the surface area of the n-side metal pillar 24 provided on the n-side interconnect layer 22 (the surface area of the n-side external terminal 24a) can be greater than the surface area of the n-side electrode 17. Thereby, it is possible to reduce the surface area of the n-side electrode 17 while ensuring a surface area of the n-side external terminal 24a that is sufficient to provide mounting having high reliability. In other words, it is possible to increase the light output by reducing the surface area of the portion (the non-light emitting region) 15f of the semiconductor layer 15 not including the light emitting layer 13 and by increasing the surface area of the portion (the light emitting region) 15e including the light emitting layer 13.

The first semiconductor layer 11 is electrically connected to the n-side metal pillar 24 via the n-side electrode 17 and the n-side interconnect layer 22. The second semiconductor layer 12 is electrically connected to the p-type metal pillar 23 via the p-side electrode 16 and the p-side interconnect layer 21.

The thickness (the thickness in the direction connecting the p-side interconnect layer 21 and the p-side external terminal 23a) of the p-type metal pillar 23 is thicker than the thickness of the p-side interconnect layer 21. The thickness (the thickness in the direction connecting the n-side interconnect layer 22 and the n-side external terminal 24a) of the n-side metal pillar 24 is thicker than the thickness of the n-side interconnect layer 22. The thicknesses of the p-type metal pillar 23, the n-side metal pillar 24, and the resin layer 25 are thicker than the semiconductor layer 15.

The aspect ratio (the ratio of the thickness to the planar size) may be 1, more than 1, or less than 1 for the metal pillars 23 and 24. In other words, the metal pillars 23 and 24 may be thicker or thinner than their planar sizes.

The thickness of the support body 100 that includes the p-side interconnect layer 21, the n-side interconnect layer 22, the p-type metal pillar 23, the n-side metal pillar 24, and the resin layer 25 is thicker than the thickness of the light emitting element (the LED chip) that includes the semiconductor layer 15, the p-side electrode 16, and the n-side electrode 17.

As described below, the semiconductor layer 15 is formed by epitaxial growth on the substrate. The substrate is removed after forming the support body 100; and the semiconductor layer 15 does not include a substrate on the first surface 15a side. The semiconductor layer 15 is supported not by a substrate that is rigid and has a plate configuration but by the support body 100 which is a compound body including the metal pillars 23 and 24 and the resin layer 25.

For example, copper, gold, nickel, silver, etc., may be used as the material of the p-side interconnect unit 41 and the n-side interconnect unit 43. Among these, good thermal conductivity, high migration resistance, and better adhesion with insulating materials can be obtained when copper is used.

The resin layer 25 reinforces the p-type metal pillar 23 and the n-side metal pillar 24. It is desirable for the resin layer 25 to have a coefficient of thermal expansion near to or the same as that of the mounting substrate. Such a resin layer 25 may include, for example, a resin including mainly an epoxy resin, a resin including mainly a silicone resin, or a resin including mainly a fluorocarbon resin.

The resin layer 25 is light-shielding to the light emitted by the light emitting layer 13 by including a light-shielding material (a light absorbing agent, a light reflecting agent, a light scattering agent, etc.) in the resin that is used as the base of the resin layer 25. Thereby, light leakage from the side surface and mounting surface side of the support body 100 can be suppressed.

Stress that is caused by the solder, etc., that bonds the p-side external terminal 23a and the n-side external terminal 24a to the lands of the mounting substrate is applied to the semiconductor layer 15 by the thermal cycles in the mounting of the semiconductor light emitting device. The stress is absorbed and relaxed by the p-type metal pillar 23, the n-side metal pillar 24, and the resin layer 25. In particular, the stress relieving effect can be increased by using the resin layer 25 that is more flexible than the semiconductor layer 15 as a portion of the support body 100.

The metal film 51 is separated from the p-side interconnect unit 41 and the n-side interconnect unit 43. Therefore, the stress that is applied to the p-type metal pillar 23 and the n-side metal pillar 24 in the mounting is not transferred to the metal film 51. Accordingly, peeling of the metal film 51 can be suppressed. Also, the stress that is applied on the side surface 15c side of the semiconductor layer 15 can be suppressed.

As described below, the substrate that is used to form the semiconductor layer 15 is removed from the semiconductor layer 15. Thereby, the semiconductor light emitting device is thinner. Further, a micro unevenness can be formed in the first surface 15a of the semiconductor layer 15 by removing the substrate; and the light extraction efficiency can be increased.

For example, the micro unevenness is formed by performing wet etching of the first surface 15a using an alkaline solution. Thereby, the total internal reflection component at the first surface 15a can be reduced; and the light extraction efficiency can be increased.

After the substrate is removed, the fluorescer layer 30 is formed on the first surface 15a with an insulating film 19 interposed. The insulating film 19 functions as an adhesion layer that increases the adhesion between the semiconductor layer 15 and the fluorescer layer 30 and is, for example, a silicon oxide film or a silicon nitride film.

The fluorescer layer 30 has a structure in which the fluorescers 31 having multiple particle configurations are dispersed in the binder 32. The binder 32 may include, for example, a silicone resin.

The fluorescer layer 30 also is formed on the region around the side surface 15c of the semiconductor layer 15. Accordingly, the planar size of the fluorescer layer 30 is larger than the planar size of the semiconductor layer 15. The fluorescer layer 30 is provided on the insulating film 18 and the insulating film 19 in the region around the side surface 15c of the semiconductor layer 15.

The fluorescer layer 30 is limited to being provided on the first surface 15a of the semiconductor layer 15 and on the region around the side surface 15c of the semiconductor layer 15 and is not formed to extend around to the second surface side of the semiconductor layer 15, around the metal pillars 23 and 24, or around to the side surface of the support body 100. The side surface of the fluorescer layer 30 is aligned with the side surface of the support body 100 (the side surface of the resin layer 25).

In other words, the semiconductor light emitting device of the embodiment is an extremely small semiconductor light emitting device having a chip size package structure. Therefore, the degrees of freedom of, for example, light fixture designs are higher in applications for light fixtures for illumination, etc.

Also, the fluorescer layer 30 is not formed unnecessarily on the mounting surface side where the light is not extracted to the outside; and the cost can be reduced. Further, the heat of the light emitting layer 13 can be dissipated to the mounting substrate side via the p-side interconnect layer 21 and the n-side interconnect layer 22 that are provided over the second surface side even without a substrate on the first surface 15a side; and the heat dissipation is excellent even though the package is small.

In general flip chip mounting, the LED chip is mounted to the mounting substrate via bumps, etc.; and subsequently, the fluorescer layer is formed to cover the entire chip. Or, a resin is under-filled between the bumps.

Conversely, according to the embodiment, the resin layer 25, which is different from the fluorescer layer 30, is provided around the p-type metal pillar 23 and around the n-side metal pillar 24 in the state prior to mounting and can provide characteristics suited to stress relief on the mounting surface side. Also, because the resin layer 25 is provided already on the mounting surface side, the under-fill after the mounting is unnecessary.

Layers that are designed with priority on the light extraction efficiency, color conversion efficiency, light distribution characteristics, etc., are provided on the first surface 15a side; and layers that are designed with priority on the stress relief in the mounting and characteristics as a support body to replace the substrate are provided on the mounting surface side. For example, the resin layer 25 has a structure in which a filler such as silica particles, etc., is filled at a high density in the resin that is used as the base; and the hardness is adjusted to be appropriate as a support body.

The light that is radiated from the light emitting layer 13 to the first surface 15a side is incident on the fluorescer layer 30; a portion of the light excites the fluorescers 31; and, for example, white light is obtained as mixed light of the light of the light emitting layer 13 and the light of the fluorescers 31.

Here, in the case where there is a substrate on the first surface 15a, light may leak to the outside from the side surface of the substrate without being incident on the fluorescer layer 30. In other words, light of the light emitting layer 13 that has a strong tint leaks from the side surface of the substrate which may cause color breakup and uneven color such as a phenomenon in which a ring of blue light is viewed at the outer edge side when the fluorescer layer 30 is viewed from the upper surface, etc.

Conversely, according to the embodiment, because there is no substrate between the first surface 15a and the fluorescer layer 30, color breakup and uneven color due to the light of the light emitting layer 13 that has a strong tint leaking from the substrate side surface can be prevented.

Further, according to the embodiment, the metal film 51 is provided on the side surface 15c of the semiconductor layer 15 with the insulating film 18 interposed. The light that is traveling from the light emitting layer 13 toward the side surface 15c of the semiconductor layer 15 is reflected by the metal film 51 and does not leak to the outside. Therefore, color breakup and uneven color due to the light leakage from the side surface side of the semiconductor light emitting device can be prevented in addition to the feature of having no substrate on the first surface 15a side.

Figure 6:
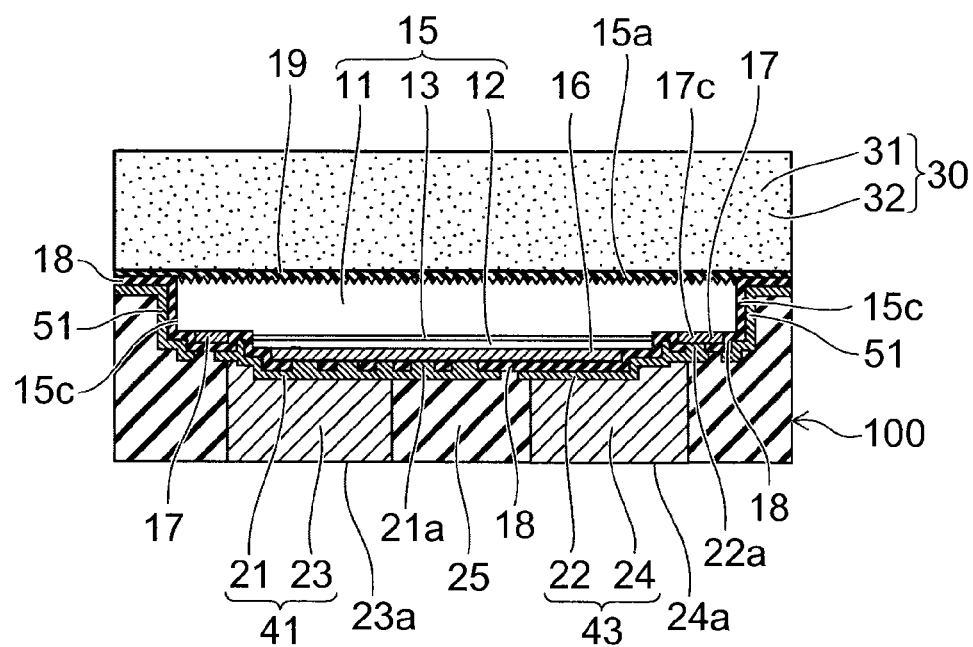
FIG. 6 is a schematic cross-sectional view of the semiconductor light emitting device of the embodiment.

As shown in FIG. 6, the metal film 51 in the region around the side surface 15c of the semiconductor layer 15 may extend toward the outer side of the semiconductor light emitting device. In other words, the metal film 51 is provided in the region around the side surface 15c of the semiconductor layer 15 to oppose the fluorescer layer 30 that juts from the first surface 15a.

Therefore, the light that is radiated by the fluorescers 31 in the end portion region of the semiconductor light emitting device to travel toward the support body 100 side can be returned toward the fluorescer layer 30 side by being reflected by the metal film 51.

Accordingly, the light extraction efficiency from the fluorescer layer 30 side can be increased by preventing the loss due to the light radiated by the fluorescers 31 being absorbed by the resin layer 25 in the end portion region of the semiconductor light emitting device.

The insulating film 18 that is provided between the metal film 51 and the side surface 15c of the semiconductor layer 15 prevents the diffusion of the metal included in the metal film 51 into the semiconductor layer 15. Thereby, for example, metal contamination of the GaN of the semiconductor layer 15 can be prevented; and the degradation of the semiconductor layer 15 can be prevented.

The insulating films 18 and 19 that are provided between the metal film 51 and the fluorescer layer 30 increase the adhesion between the metal film 51 and the base resin of the fluorescer layer 30.

The insulating film 18 and the insulating film 19 are, for example, inorganic insulating films such as a silicon oxide film, a silicon nitride film, etc. In other words, the first surface 15a and the second surface of the semiconductor layer 15, the side surface 15c of the first semiconductor layer 11, the side surface of the second semiconductor layer 12, and the side surface of the light emitting layer 13 are covered with the inorganic insulating films. The inorganic insulating films are provided around the semiconductor layer 15 to block the semiconductor layer 15 from metal, moisture, etc.

A method for manufacturing the semiconductor light emitting device will now be described with reference to FIG. 7A to FIG. 13B.

The cross-sectional views of FIG. 7A to FIG. 13B correspond to the cross section shown in FIG. 1, i.e., the A-A cross section of FIG. 2A.

Figure 7A:
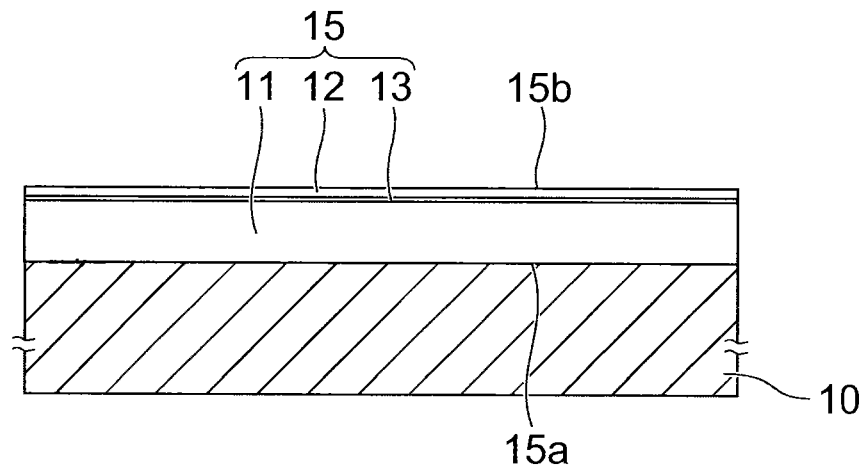
FIG. 7A to FIG. 16C are schematic cross-sectional views showing a method for manufacturing the semiconductor light emitting device of the embodiment.

As shown in FIG. 7A, for example, the first semiconductor layer 11, the light emitting layer 13, and the second semiconductor layer 12 are epitaxially grown in order on the major surface of a substrate 10 by MOCVD (metal organic chemical vapor deposition).

The surface of the semiconductor layer 15 on the substrate 10 side is the first surface 15a; and the surface of the semiconductor layer 15 on the side opposite to the substrate 10 is the second surface 15b.

The substrate 10 is, for example, a silicon substrate. Or, the substrate 10 may be a sapphire substrate. The semiconductor layer 15 is, for example, a nitride semiconductor layer including gallium nitride (GaN).

The first semiconductor layer 11 includes, for example, a buffer layer provided on the major surface of the substrate 10, and an n-type GaN layer provided on the buffer layer. The second semiconductor layer 12 includes, for example, a p-type AlGaN layer provided on the light emitting layer 13, and a p-type GaN layer provided on the p-type AlGaN layer. The light emitting layer 13 has, for example, a MQW (Multiple Quantum Well) structure.

Figure 7B:
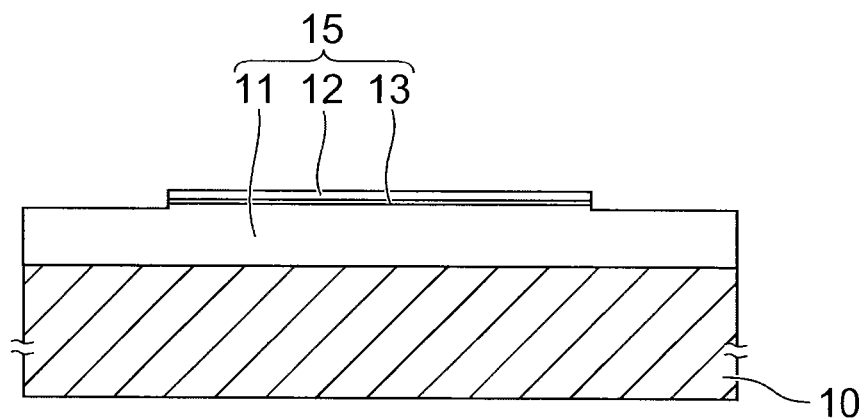

FIG. 7B shows the state in which the second semiconductor layer 12 and the light emitting layer 13 are selectively removed. For example, the first semiconductor layer 11 is exposed by selectively etching the second semiconductor layer 12 and the light emitting layer 13 by RIE (Reactive Ion Etching).

Then, as shown in FIG. 8A, a trench 90 is made by selectively removing the first semiconductor layer 11. The semiconductor layer 15 is divided into a plurality on the major surface of the substrate 10 by the trench 90. The trench 90 is made in, for example, a lattice pattern on the substrate 10 having a wafer configuration.

The trench 90 pierces the semiconductor layer 15 to reach the substrate 10. According to the etching conditions, there are cases where the major surface of the substrate 10 also is etched slightly such that the bottom surface of the trench 90 recedes to be lower than the interface between the substrate 10 and the semiconductor layer 15. The trench 90 may be made after forming the p-side electrode 16 and the n-side electrode 17.

Figure 8B:
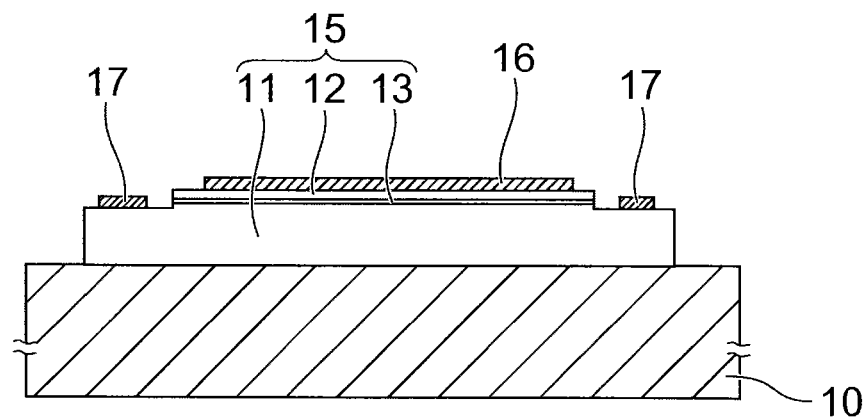

As shown in FIG. 8B, the p-side electrode 16 is formed on the surface of the second semiconductor layer 12. The n-side electrode 17 is formed on the surface of the first semiconductor layer 11 in the region where the second semiconductor layer 12 and the light emitting layer 13 are selectively removed.

As described above referring to FIG. 2B, prior to forming the n-side electrode 17, the insulating film 28 is formed on the surface of the first semiconductor layer 11 in the region where the corners 17b of the n-side electrode 17 are to be formed; and the corners 17b are formed on the insulating film 28.

The p-side electrode 16 that is formed in the region where the light emitting layer 13 is stacked includes a reflective film that reflects the light radiated by the light emitting layer 13. For example, the p-side electrode 16 includes silver, a silver alloy, aluminum, an aluminum alloy, etc. Also, the p-side electrode 16 includes a metal protective film (a barrier metal) to prevent sulfidization and oxidization of the reflective film.

Figure 9A:
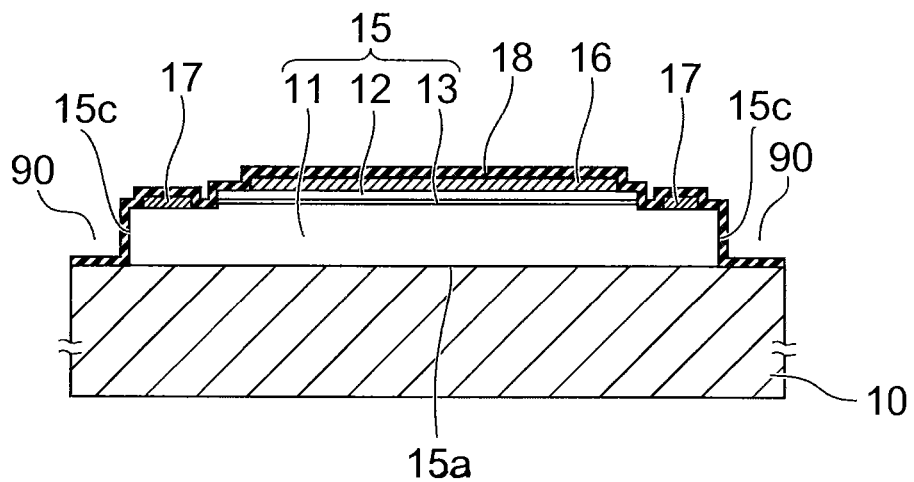
Figure 9B:
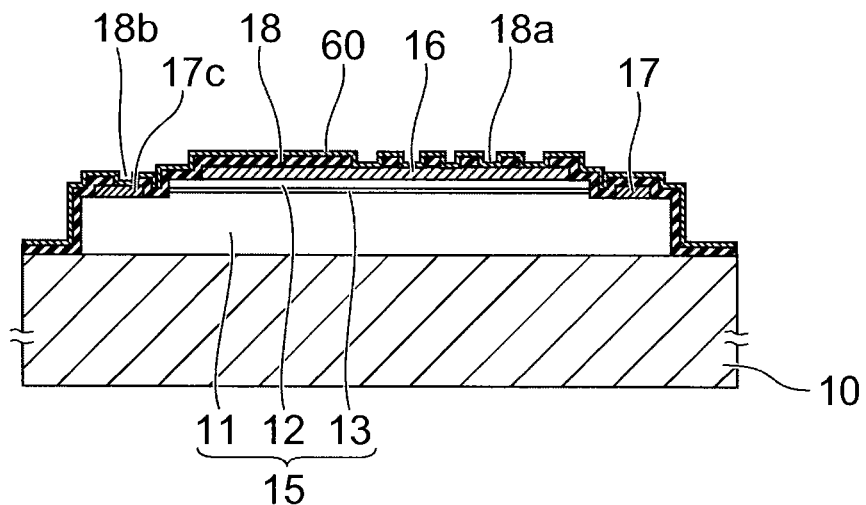

Then, as shown in FIG. 9A, the insulating film 18 is formed to cover the structural body provided on the substrate 10. The insulating film 18 covers the second surface of the semiconductor layer 15, the p-side electrode 16, and the n-side electrode 17. Also, the insulating film 18 covers the side surface 15c continuing from the first surface 15a of the semiconductor layer 15. The insulating film 18 also is formed on the surface of the substrate 10 at the bottom surface of the trench 90.

The insulating film 18 is a silicon oxide film or a silicon nitride film formed by, for example, CVD (Chemical Vapor Deposition). As shown in FIG. 9B, the first openings 18a and the second opening 18b are made in the insulating film 18 by, for example, wet etching using a resist mask. The first openings 18a reach the p-side electrode 16; and the second opening 18b reaches the contact portion 17c of the n-side electrode 17.

Then, as shown in FIG. 9B, the foundation metal film 60 is formed on the surface of the insulating film 18, the inner walls (the side walls and bottom surfaces) of the first openings 18a, and the inner walls (the side wall and bottom surface) of the second opening 18b. As shown in FIG. 10A, the foundation metal film 60 includes the aluminum film 61, the titanium film 62, and the copper film 63. The foundation metal film 60 is formed by, for example, sputtering.

Figure 10B:
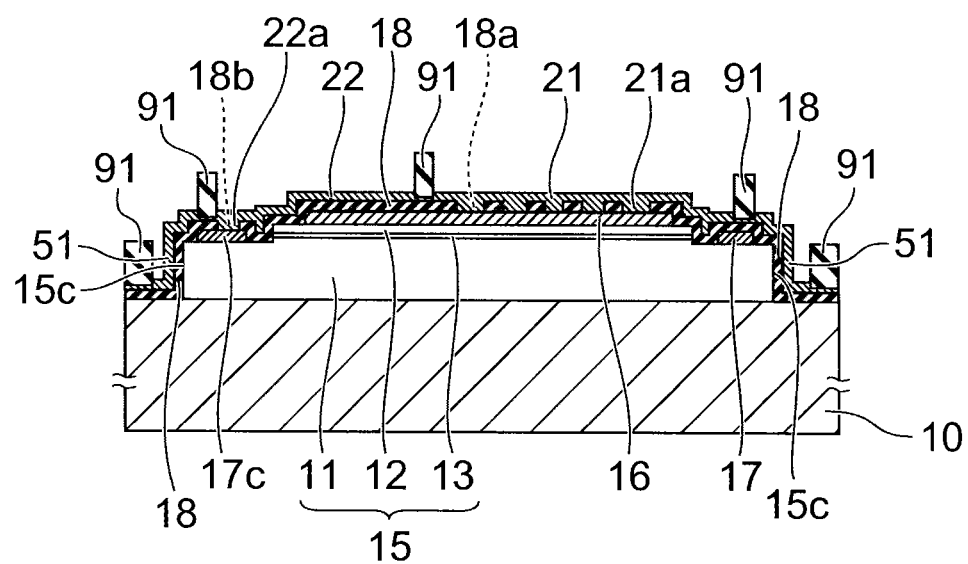

Continuing, the p-side interconnect layer 21, the n-side interconnect layer 22, and the metal film 51 are formed by copper electroplating using the copper film 63 of the foundation metal film 60 as a seed layer after selectively forming a resist mask 91 shown in FIG. 10B on the foundation metal film 60.

The p-side interconnect layer 21 also is formed inside the first openings 18a and is electrically connected to the p-side electrode 16. The n-side interconnect layer 22 also is formed inside the second opening 18b and is electrically connected to the contact portion 17c of the n-side electrode 17.

Figure 11A:
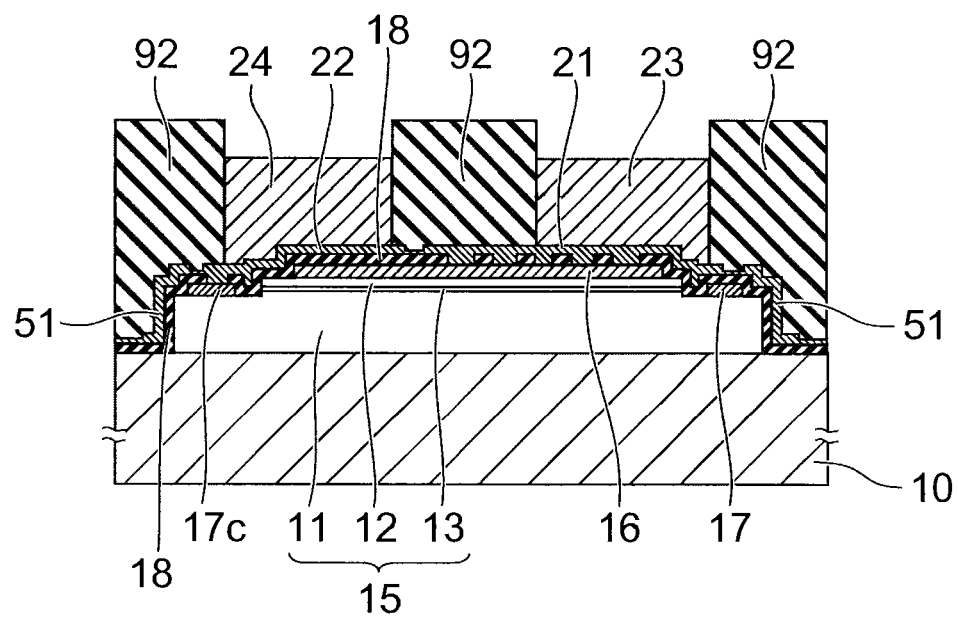

Then, after removing the resist mask 91 using, for example, a solvent or oxygen plasma, a resist mask 92 shown in FIG. 11A is selectively formed. Or, the resist mask 92 may be formed without removing the resist mask 91.

After forming the resist mask 92, the p-type metal pillar 23 and the n-side metal pillar 24 are formed by copper electroplating using the p-side interconnect layer 21 and the n-side interconnect layer 22 as a seed layer.

The p-type metal pillar 23 is formed on the p-side interconnect layer 21. The p-side interconnect layer 21 and the p-type metal pillar 23 are formed in a single body made of the same copper material. The n-side metal pillar 24 is formed on the n-side interconnect layer 22. The n-side interconnect layer 22 and the n-side metal pillar 24 are formed in a single body made of the same copper material.

The resist mask 92 is removed using, for example, a solvent or oxygen plasma. At this point in time, the p-side interconnect layer 21 and the n-side interconnect layer 22 are linked to each other via the foundation metal film 60. Also, the p-side interconnect layer 21 and the metal film 51 are linked to each other via the foundation metal film 60; and the n-side interconnect layer 22 and the metal film 51 are linked to each other via the foundation metal film 60.

Therefore, the foundation metal film 60 that is between the p-side interconnect layer 21 and the n-side interconnect layer 22, the foundation metal film 60 that is between the p-side interconnect layer 21 and the metal film 51, and the foundation metal film 60 that is between the n-side interconnect layer 22 and the metal film 51 are removed by etching.

Figure 11B:
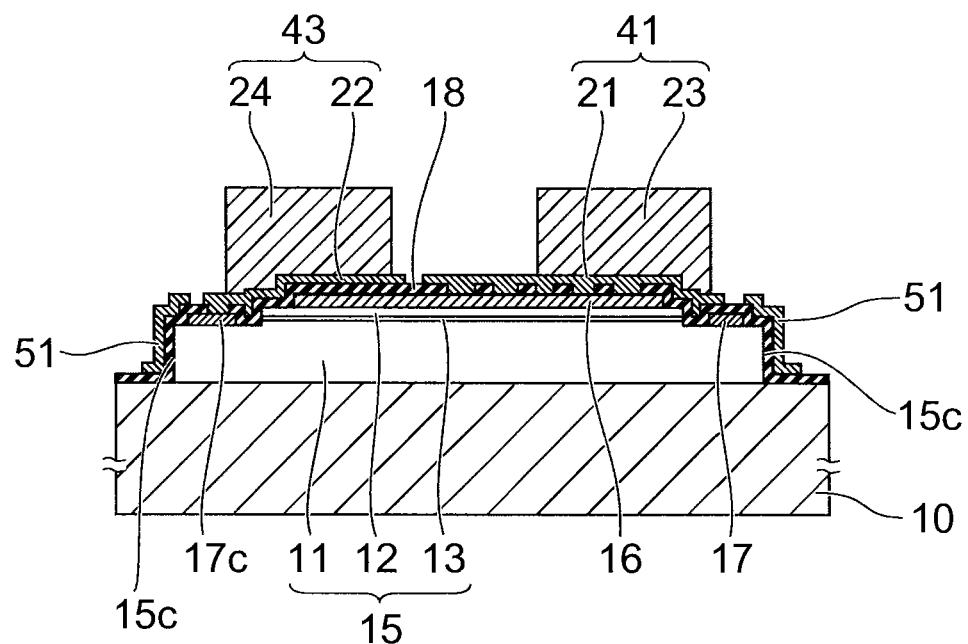

Thereby, as shown in FIG. 11B, the electrical connection between the p-side interconnect layer 21 and the n-side interconnect layer 22, the electrical connection between the p-side interconnect layer 21 and the metal film 51, and the electrical connection between the n-side interconnect layer 22 and the metal film 51 are broken.

The metal film 51 that is formed in the region around the side surface 15c of the semiconductor layer 15 is electrically floating, does not function as an electrode, and functions as a reflective film. The metal film 51 is ensured to function as the reflective film by including at least the aluminum film 61.

Figure 12A:
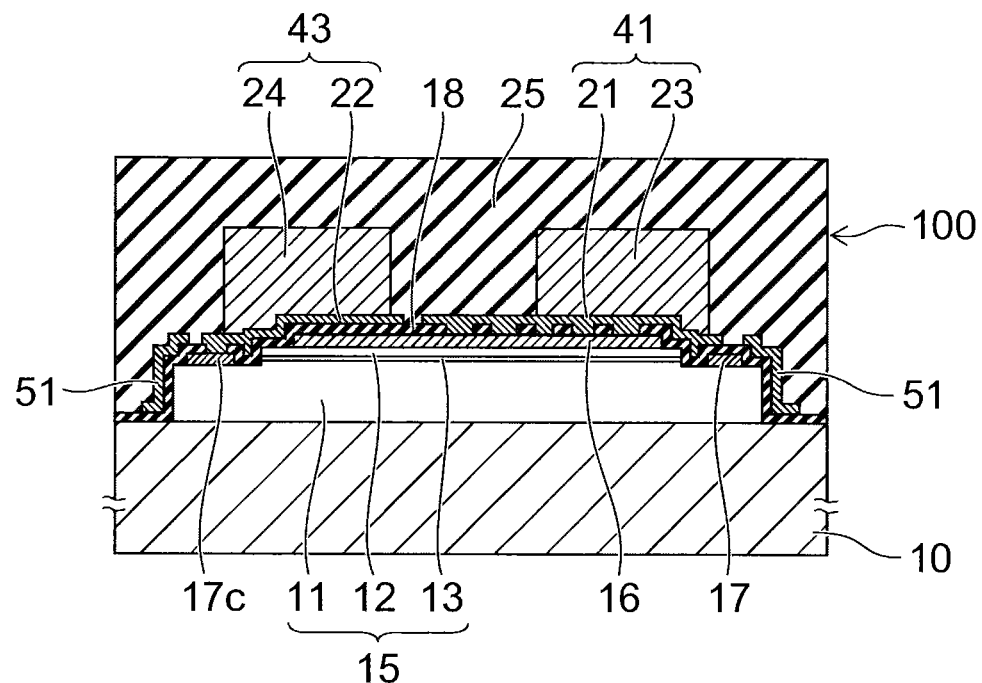

Then, the resin layer 25 shown in FIG. 12A is formed on the structural body shown in FIG. 11B. The resin layer 25 covers the p-side interconnect unit 41 and the n-side interconnect unit 43. Also, the resin layer 25 covers the metal film 51.

The resin layer 25 is included in the support body 100 with the p-side interconnect unit 41 and the n-side interconnect unit 43. The substrate 10 is removed in the state in which the semiconductor layer 15 is supported by the support body 100.

For example, the substrate 10 which is a silicon substrate is removed by wet etching or dry etching. Or, in the case where the substrate 10 is a sapphire substrate, the substrate 10 can be removed by laser lift-off.

There are cases where the semiconductor layer 15 that is epitaxially grown on the substrate 10 has a large internal stress. The p-type metal pillar 23, the n-side metal pillar 24, and the resin layer 25 are materials that are more flexible than the semiconductor layer 15 that is made of, for example, a GaN-based material. Accordingly, even in the case where the internal stress of the epitaxial growth is relieved all at once when peeling the substrate 10, the stress is absorbed by the p-type metal pillar 23, the n-side metal pillar 24, and the resin layer 25. Therefore, damage of the semiconductor layer 15 in the process of removing the substrate 10 can be avoided.

Figure 12B:
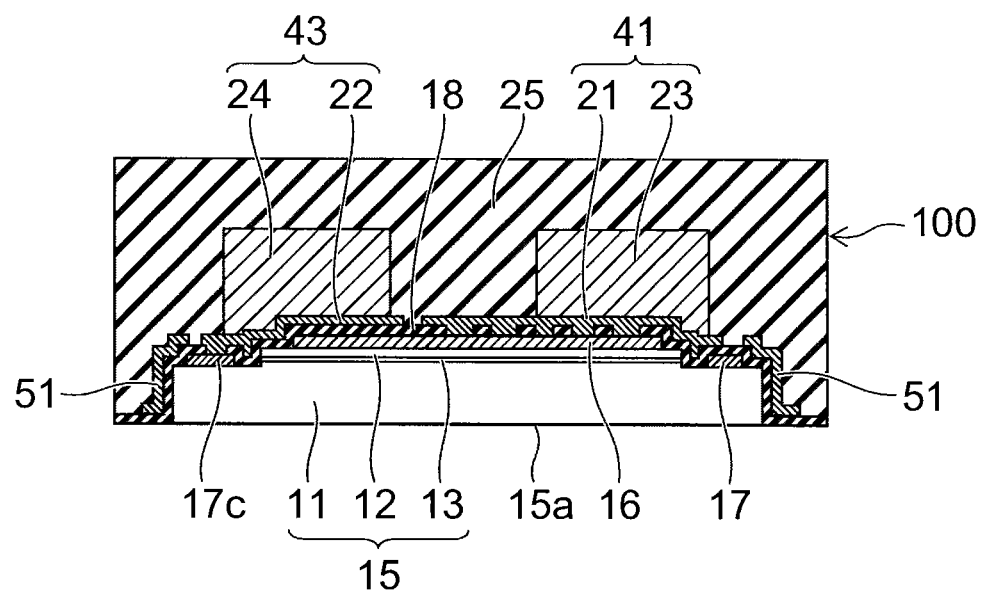

As shown in FIG. 12B, the first surface 15a of the semiconductor layer 15 is exposed by the removal of the substrate 10. A micro unevenness is formed in the first surface 15a that is exposed. For example, wet etching of the first surface 15a is performed using a KOH (potassium hydroxide) aqueous solution, TMAH (tetramethyl ammonium hydroxide), etc. Different etching rates that depend on the crystal plane orientation occur in the etching. Therefore, the unevenness can be formed in the first surface 15a. The extraction efficiency of the light radiated by the light emitting layer 13 can be increased by forming the micro unevenness in the first surface 15a.

Figure 13A:
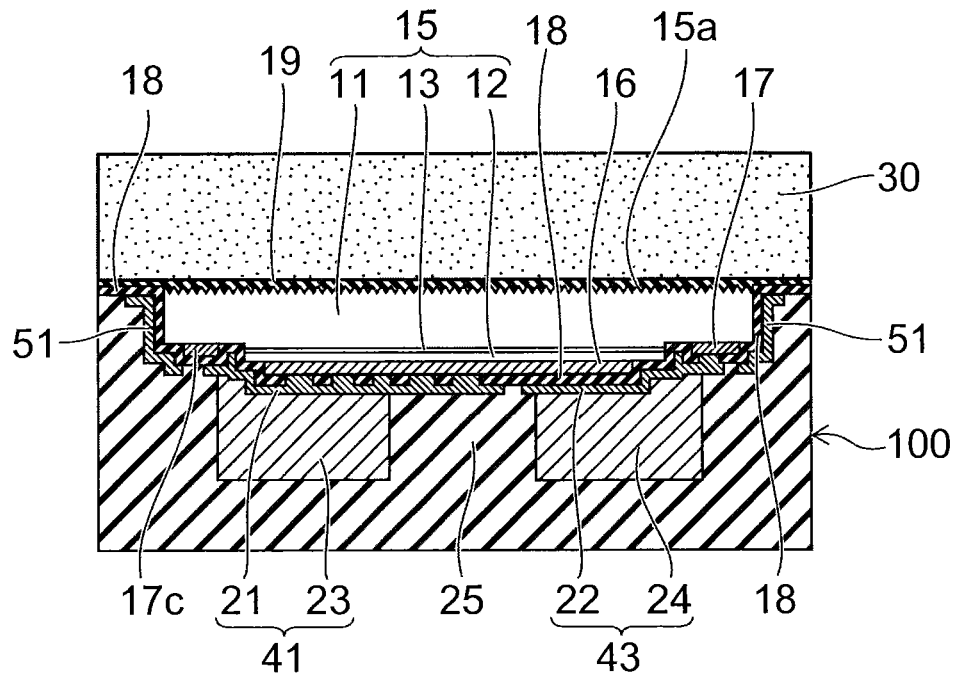

As shown in FIG. 13A, the fluorescer layer 30 is formed on the first surface 15a with the insulating film 19 interposed. The fluorescer layer 30 is formed by a method such as, for example, printing, potting, molding, compression molding, etc. The insulating film 19 increases the adhesion between the semiconductor layer 15 and the fluorescer layer 30.

As the fluorescer layer 30, a cured fluorescer that is made of fluorescers cured in a binder may be bonded to the semiconductor layer 15 with the insulating film 19 interposed.

The fluorescer layer 30 also is formed on the region around the side surface 15c of the semiconductor layer 15. The resin layer 25 is provided also in the region around the side surface 15c of the semiconductor layer 15. The fluorescer layer 30 is formed on the resin layer 25 with the insulating films 18 and 19 interposed.

Figure 13B:
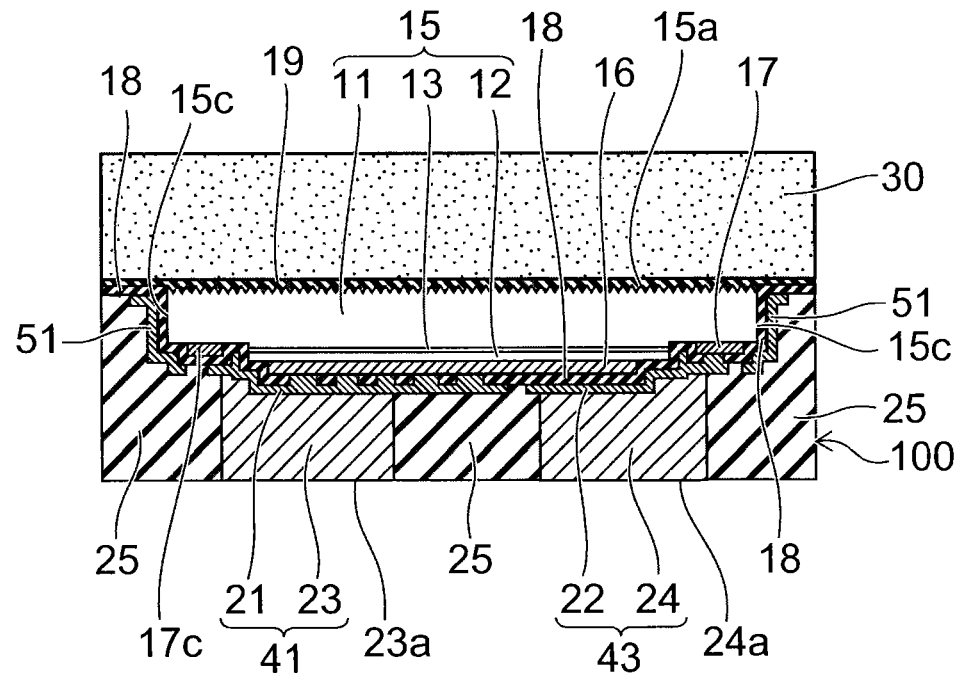

After forming the fluorescer layer 30, the p-type metal pillar 23 and the n-side metal pillar 24 are exposed from the resin layer 25 as shown in FIG. 13B by polishing the surface (in FIG. 13A, the lower surface) of the resin layer 25. The exposed surface of the p-type metal pillar 23 is used as the p-side external terminal 23a; and the exposed surface of the n-side metal pillar 24 is used as the n-side external terminal 24a.

Then, the structural body shown in FIG. 13B is cut in the region where the trench 90 described above is made to divide the multiple semiconductor layers 15. In other words, the fluorescer layer 30, the insulating film 19, the insulating film 18, and the resin layer 25 are cut. These components are cut by, for example, a dicing blade or laser light. The semiconductor layer 15 is not damaged by the dicing because the semiconductor layer 15 does not exist in the dicing region.

The processes described above prior to the singulation are performed in the wafer state that includes many semiconductor layers 15. The wafer is singulated into semiconductor light emitting devices including at least one semiconductor layer 15 each. The semiconductor light emitting device may have a single-chip structure including one semiconductor layer 15; or a multi-chip structure including multiple semiconductor layers 15 may be used.

Because the processes described above prior to the singulation can be performed collectively in the wafer state, it is unnecessary to perform the formation of the interconnect layers, the formation of the pillars, the packaging with the resin layer, and the formation of the fluorescer layer for every singulated individual device; and a drastic cost reduction is possible.

Because the support body 100 and the fluorescer layer 30 are cut after being formed in the wafer state, the side surface of the fluorescer layer 30 is aligned with the side surface of the support body 100 (the side surface of the resin layer 25); and these side surfaces form the side surface of the singulated semiconductor light emitting device. And, because there is no substrate 10, a small semiconductor light emitting device having a chip size package structure can be provided.

Figure 3A:
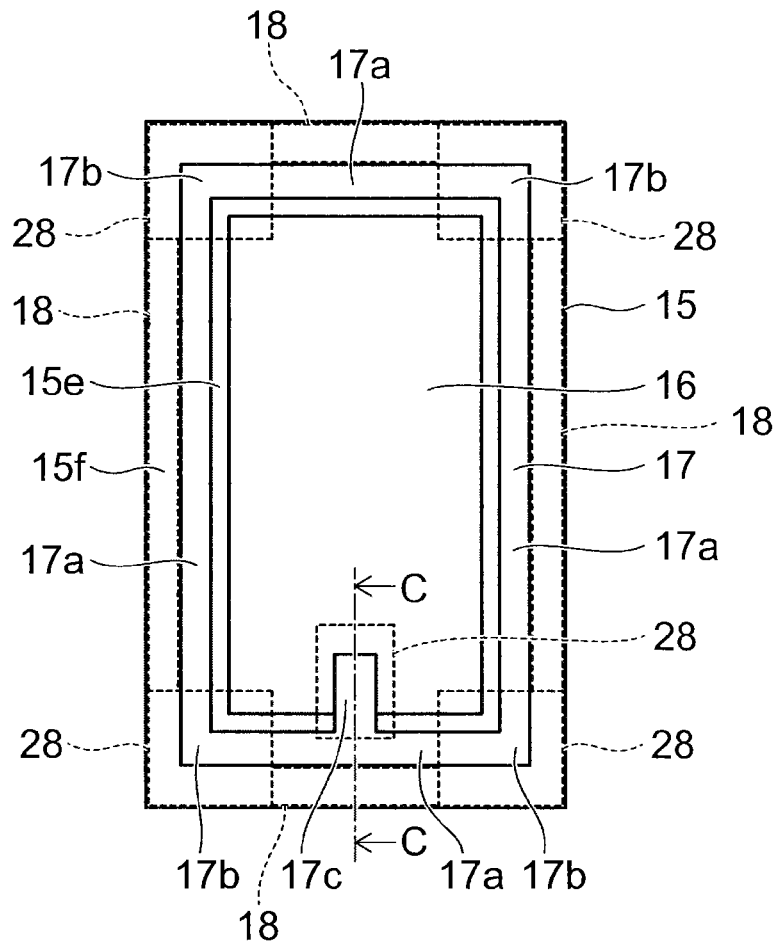
FIG. 3A is a schematic plan view of the semiconductor light emitting device of the embodiment.

FIG. 3A is a schematic plan view showing another specific example of the planar layout of the p-side electrode 16 and the n-side electrode 17 of the semiconductor light emitting device of the embodiment.

Figure 3B:
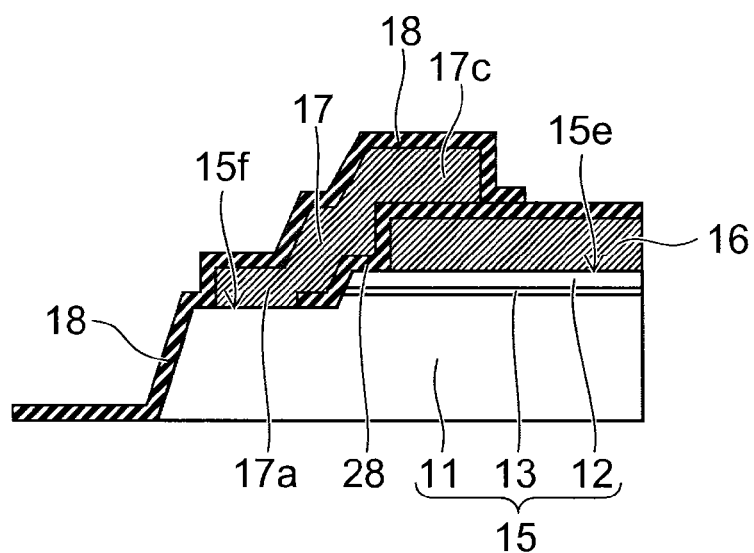
FIG. 3B is a C-C cross-sectional view of FIG. 3A.

FIG. 3B is a C-C cross-sectional view of FIG. 3A.

In the specific example shown in FIG. 3A as well, as shown in FIG. 2B, the insulating film 28 is provided between the first semiconductor layer 11 and the corners 17b of the n-side electrode 17; and the corners 17b do not contact the first semiconductor layer 11. Therefore, the current concentration at the corners 17b can be relaxed. The straight portions 17a that are between the corners 17b contact the surface of the first semiconductor layer 11.

In the specific example shown in FIG. 3A, the contact portion 17c that is connected to the n-side interconnect layer 22 overlaps the p-side electrode 16 and the stacked portion including the light emitting layer 13. As shown in FIG. 3B, the insulating film (e.g., the silicon oxide film) 28 is provided between the p-side electrode 16 and the contact portion 17c that is on the p-side electrode 16; and the contact portion 17c does not contact the p-side electrode 16. The insulating film 28 is provided also between the contact portion 17c and the second semiconductor layer 12; and the contact portion 17c does not contact the second semiconductor layer 12. Also, the contact portion 17c does not contact the first semiconductor layer 11.

Corners are formed also between the contact portion 17c and the straight portion 17a of the n-side electrode 17; and there is a tendency for the current to concentrate easily in the corners. Therefore, in the specific example shown in FIGS. 3A and 3B, the current concentration at the corners formed between the contact portion 17c and the straight portion 17a can be relaxed by the contact portion 17c not contacting the first semiconductor layer 11. In other words, the imbalance of the light emission intensity and/or heat distribution at the corners formed between the contact portion 17c and the straight portion 17a can be suppressed.

The contact portion 17c extends to overlap the stacked portion (the light emitting region) including the light emitting layer 13. Stated conversely, a portion of the stacked portion (the light emitting region) including the light emitting layer 13 is provided in the region where the n-side electrode 17 is formed; and the light emitting region can be enlarged without reducing the surface area of the n-side electrode 17.

Figure 5:
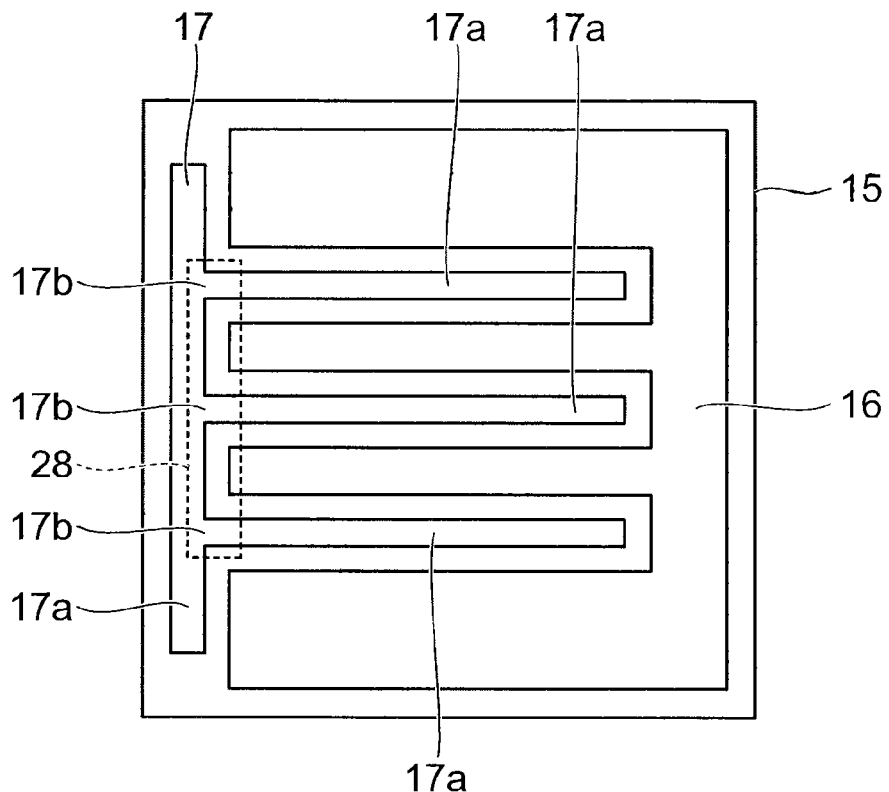
FIG. 5 is a schematic plan view of the semiconductor light emitting device of the embodiment.

The electrode layout is not limited to the pattern in which the n-side electrode 17 is provided around the p-side electrode 16; and, for example, a pattern may be used in which the multiple straight portions 17a of the n-side electrode 17 extend toward the p-side electrode 16 side as shown in FIG. 5.

In such a case as well, the current concentration at the corners 17b can be relaxed by using a structure in which the corners 17b that are formed between the multiple straight portions 17a extending in different directions do not contact the first semiconductor layer 11 by providing the insulating film 28 between the first semiconductor layer 11 and the corners 17b.

Figure 4A:
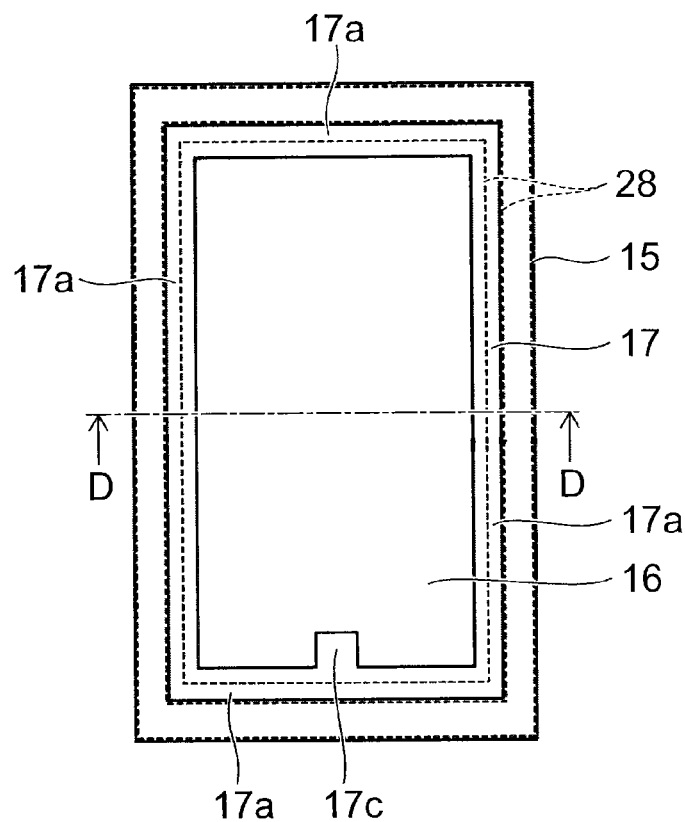
FIGS. 4A and 4B are schematic plan views of the semiconductor light emitting device of the embodiment.

FIG. 4A is a schematic plan view showing another specific example of the planar layout of the p-side electrode 16 and the n-side electrode 17 of the semiconductor light emitting device of the embodiment.

Figure 16A:
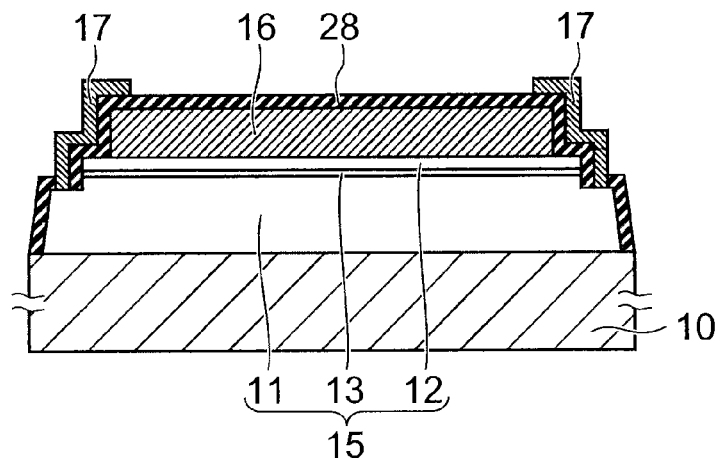
Figure 16B:
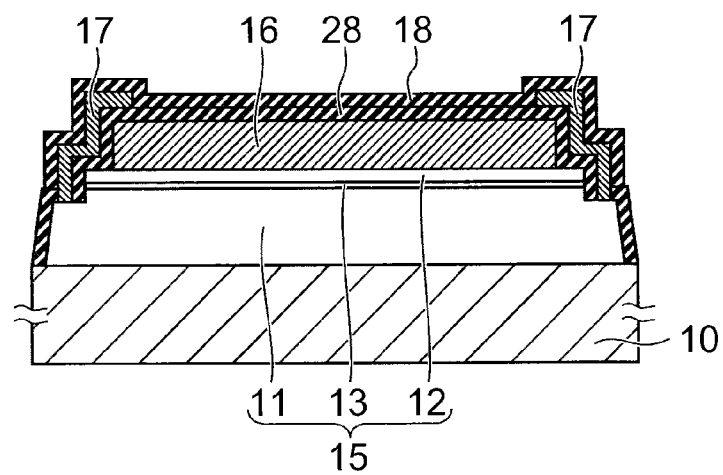
Figure 16C:
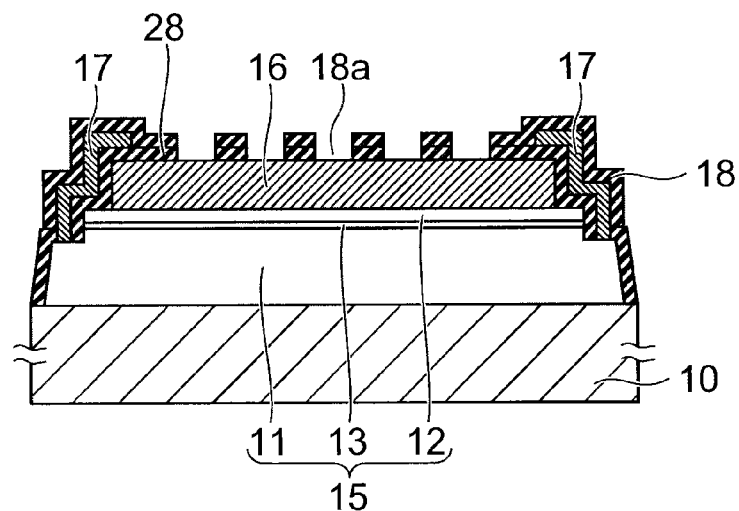

FIG. 16C is a D-D cross-sectional view of FIG. 4A.

According to the specific example, the n-side electrode 17 is provided at the outer circumferential side of the p-side electrode 16; and the portion of the n-side electrode 17 on the inner circumferential surface of the n-side electrode 17 overlaps the p-side electrode 16 with the insulating film 28 interposed. In other words, the portion of the n-side electrode 17 on the inner circumferential surface of the n-side electrode 17 overlaps the stacked portion (the light emitting region) including the light emitting layer 13. The portion of the n-side electrode 17 on the outer circumferential side of the n-side electrode 17 contacts the surface of the first semiconductor layer 11.

In the specific example as well, a portion of the stacked portion (the light emitting region) including the light emitting layer 13 is provided in the region where the n-side electrode 17 is formed; and the light emitting region can be enlarged without reducing the surface area of the n-side electrode 17.

Figure 4B:
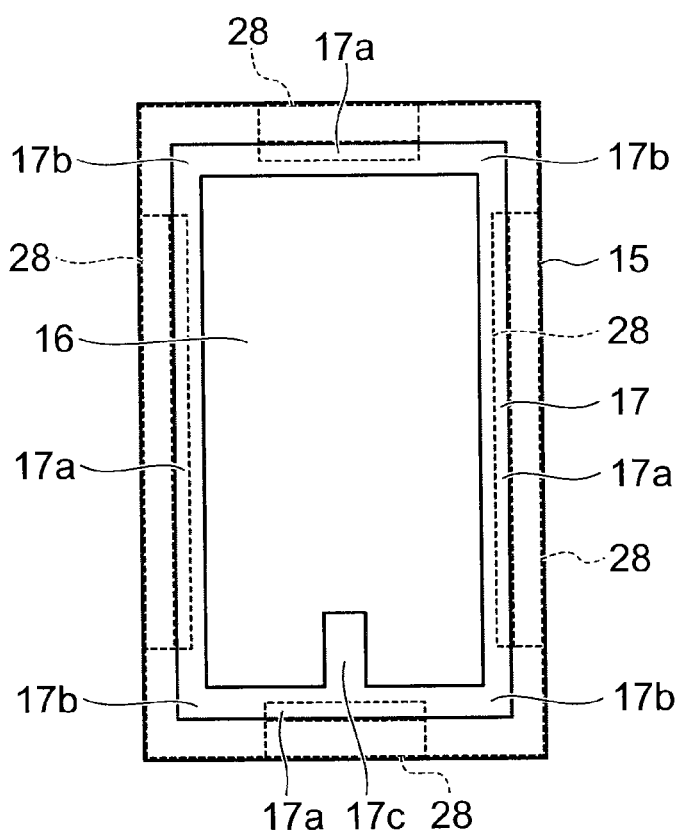

In the structure shown in FIG. 4A, the insulating film 28 may be provided between the first semiconductor layer 11 and the corners 17b as shown in FIG. 4B. According to the structure shown in FIG. 4B, a uniform light emission is possible over a large surface area.

FIG. 14A to FIG. 16C are schematic cross-sectional views showing a method for forming the electrode structure shown in FIG. 4A. The cross-sectional views of FIG. 14A to FIG. 16C correspond to the D-D cross section of FIG. 4A.

Figure 14A:
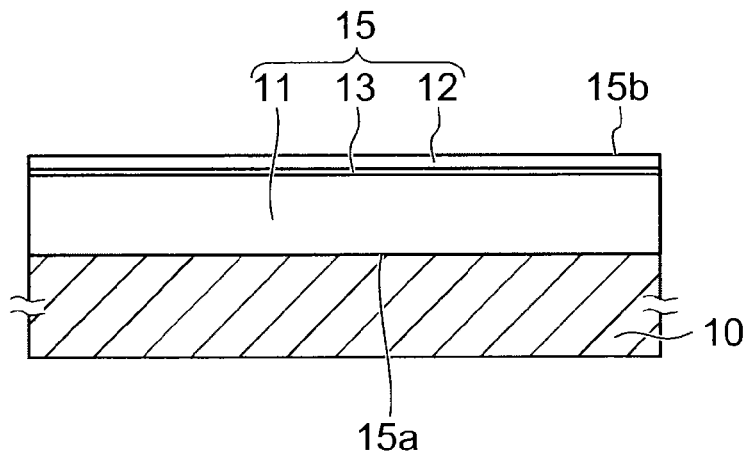

As shown in FIG. 14A, for example, the first semiconductor layer 11, the light emitting layer 13, and the second semiconductor layer 12 are epitaxially grown in order on the major surface of the substrate 10 by MOCVD.

The surface of the semiconductor layer 15 on the substrate 10 side is the first surface 15a; and the surface of the semiconductor layer 15 on the side opposite to the substrate 10 is the second surface 15b.

Figure 14B:
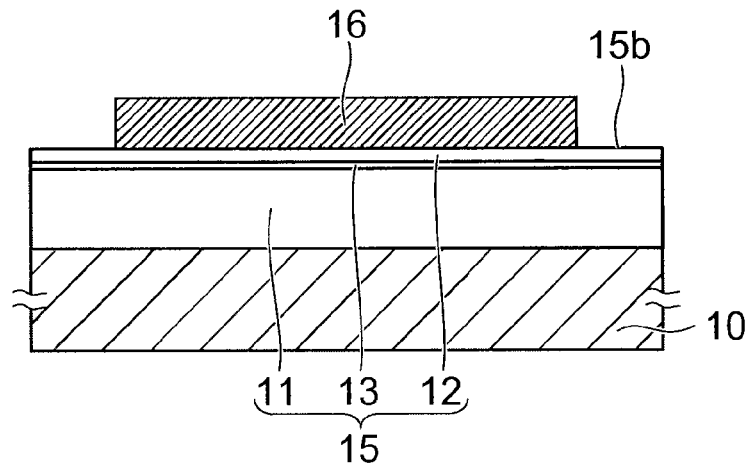

Then, as shown in FIG. 14B, the p-side electrode 16 is formed on the surface of the second semiconductor layer 12.

Figure 14C:
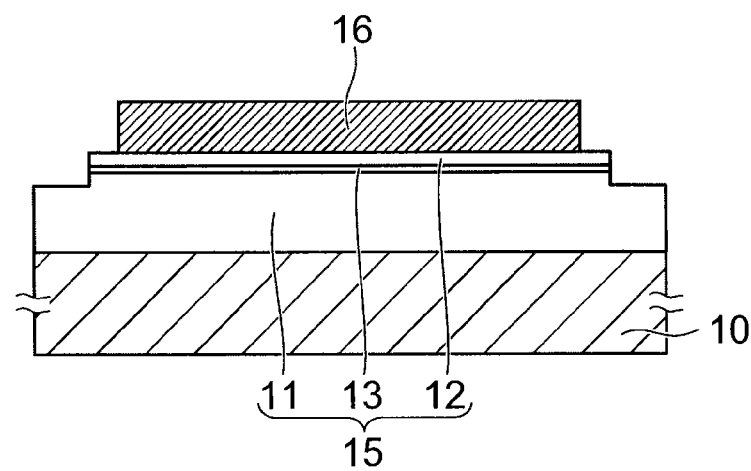

Continuing as shown in FIG. 14C, the first semiconductor layer 11 is exposed by selectively etching and removing the second semiconductor layer 12 and the light emitting layer 13 in the region where the p-side electrode 16 is not formed.

Figure 15A:
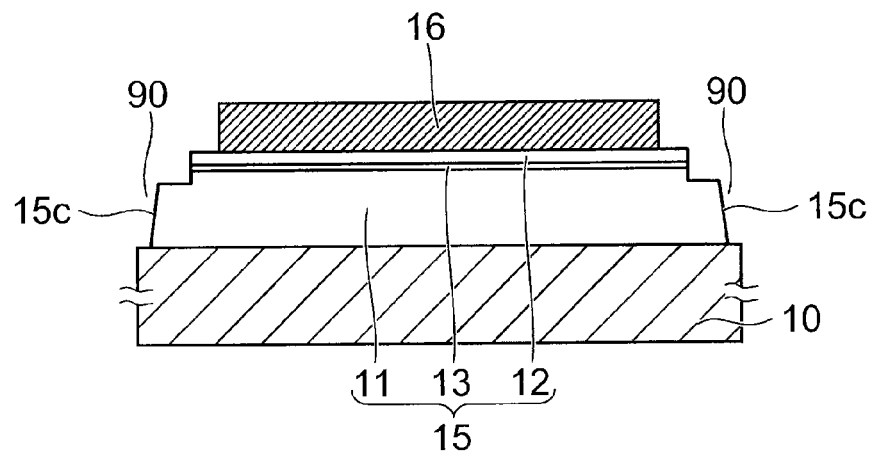

Then, as shown in FIG. 15A, the trench 90 is made to reach the substrate 10 by selectively removing the first semiconductor layer 11 in the region where the first semiconductor layer 11 is exposed. The semiconductor layer 15 is divided into a plurality on the major surface of the substrate 10 by the trench 90.

Figure 15B:
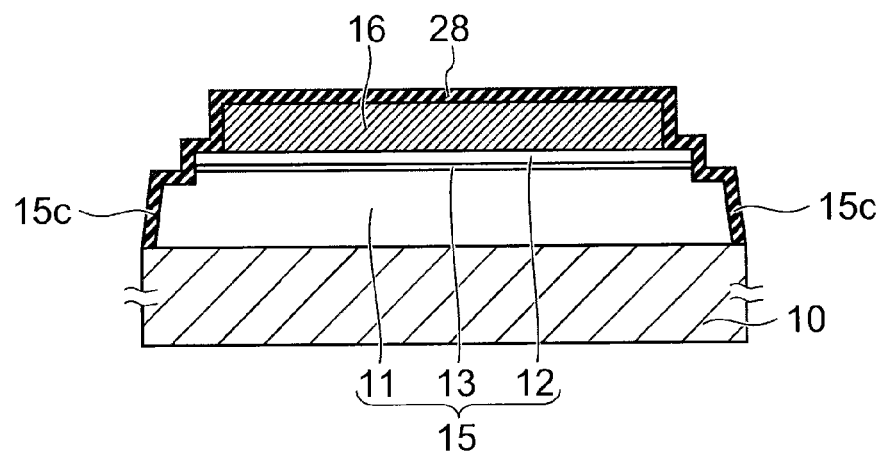

Continuing as shown in FIG. 15B, the insulating film 28 is formed on the exposed surfaces of the semiconductor layer 15 and the p-side electrode 16.

The semiconductor layer 15 may be divided into a plurality by forming the insulating film 28 after the process shown in FIG. 14C and by subsequently etching the first semiconductor layer 11.

Figure 15C:
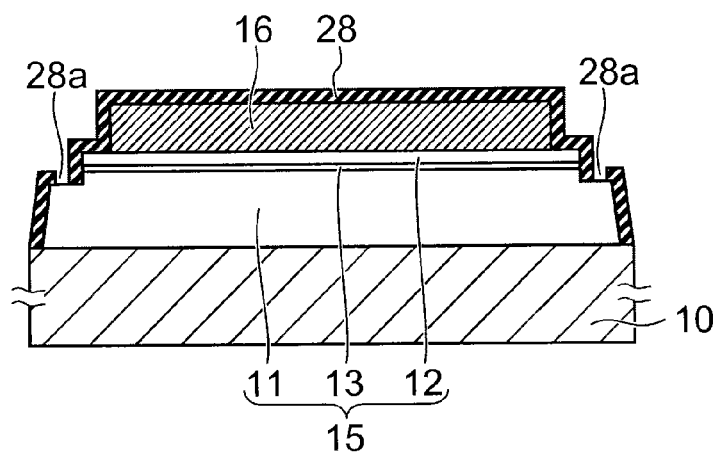

After forming the insulating film 28, an opening 28a is made in the insulating film 28 in the region where the light emitting layer 13 and the second semiconductor layer 12 are removed as shown in FIG. 15C. The surface of the first semiconductor layer 11 is exposed in the opening 28a.

As shown in FIG. 16A, the n-side electrode 17 is formed inside the opening 28a. The n-side electrode 17 contacts the surface of the first semiconductor layer 11 inside the opening 28a. A portion of the n-side electrode 17 also is formed on the second semiconductor layer 12 with the insulating film 28 interposed and on the p-side electrode 16 with the insulating film 28 interposed.

As shown in FIG. 16B, the insulating film 18 is formed on the surface of the structural body shown in FIG. 16A. The n-side electrode 17 is covered with the insulating film 18. As shown in FIG. 16C, the multiple openings 18a are made in the insulating films 28 and 18 on the p-side electrode 16 to reach the p-side electrode 16. The p-side electrode 16 is connected via the openings 18a to the p-side interconnect layer 21 that is formed in a subsequent process.

An opening is made in the insulating film 18 on the contact portion 17c of the n-side electrode 17 shown in FIG. 4A to reach the contact portion 17c. The contact portion 17c of the n-side electrode 17 is connected via the opening to the n-side interconnect layer 22 that is formed in a subsequent process.

Thereafter, similarly to the embodiment described above, the p-side interconnect layer 21, the n-side interconnect layer 22, the metal film 51, the p-type metal pillar 23, and the n-side metal pillar 24 are formed by plating.

After the resin layer 25 is formed, the substrate 10 is removed; and the fluorescer layer 30 is formed on the first surface 15a side. Subsequently, singulation is performed.

FIG. 20A to FIG. 21B show another specific example of the method for forming the structure in which the n-side electrode 17 overlaps the p-side electrode 16 with the insulating film 28 interposed.

Figure 20A:
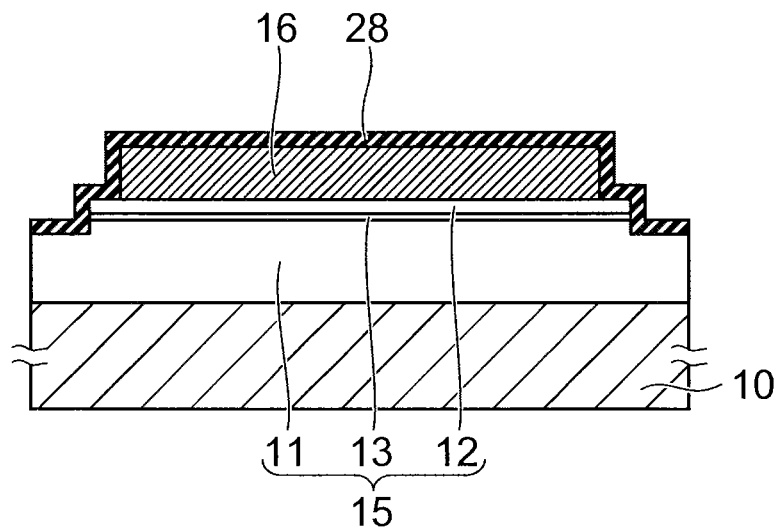
FIG. 20A to FIG. 21B are schematic cross-sectional views showing a method for manufacturing the semiconductor light emitting device of the embodiment.

After the processes shown in FIGS. 14A to 14C described above, the insulating film 28 is formed on the exposed surfaces of the semiconductor layer 15 and the p-side electrode 16 as shown in FIG. 20A.

Figure 20B:
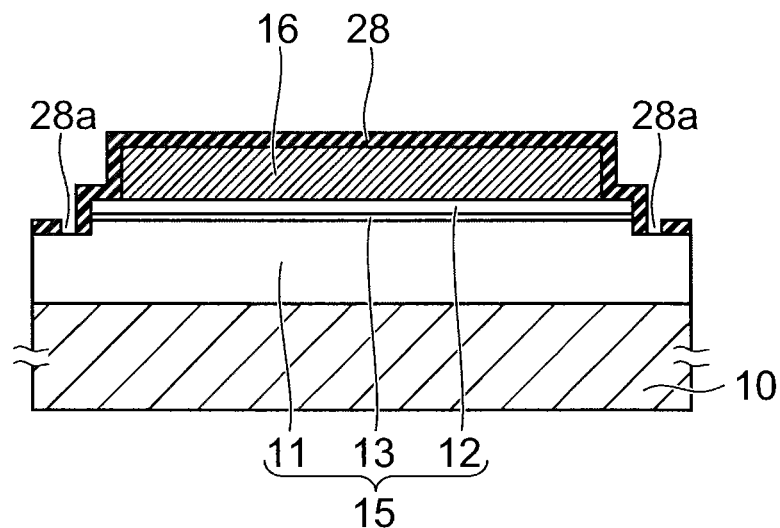

After forming the insulating film 28, the opening 28a is made as shown in FIG. 20B in the insulating film 28 in the region where the light emitting layer 13 and the second semiconductor layer 12 are removed. The surface of the first semiconductor layer 11 is exposed in the opening 28a.

Figure 21A:
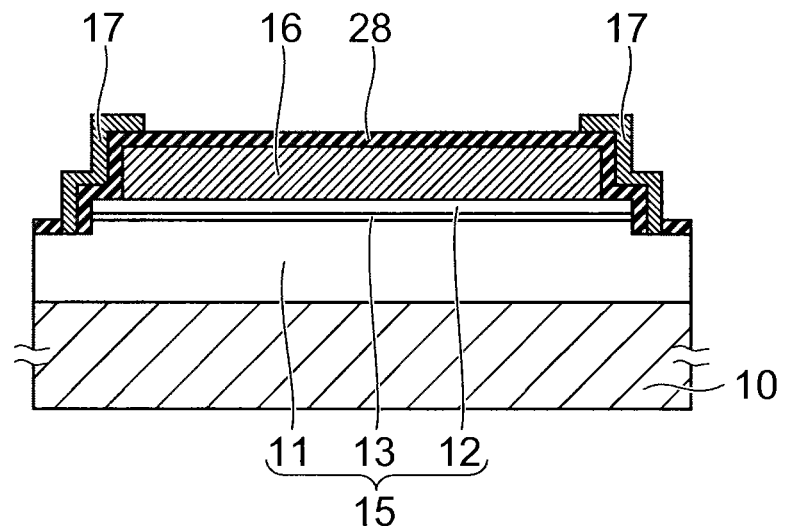

As shown in FIG. 21A, the n-side electrode 17 is formed inside the opening 28a. The n-side electrode 17 contacts the surface of the first semiconductor layer 11 inside the opening 28a. A portion of the n-side electrode 17 also is formed on the second semiconductor layer 12 with the insulating film 28 interposed and on the p-side electrode 16 with the insulating film 28 interposed.

Figure 21B:
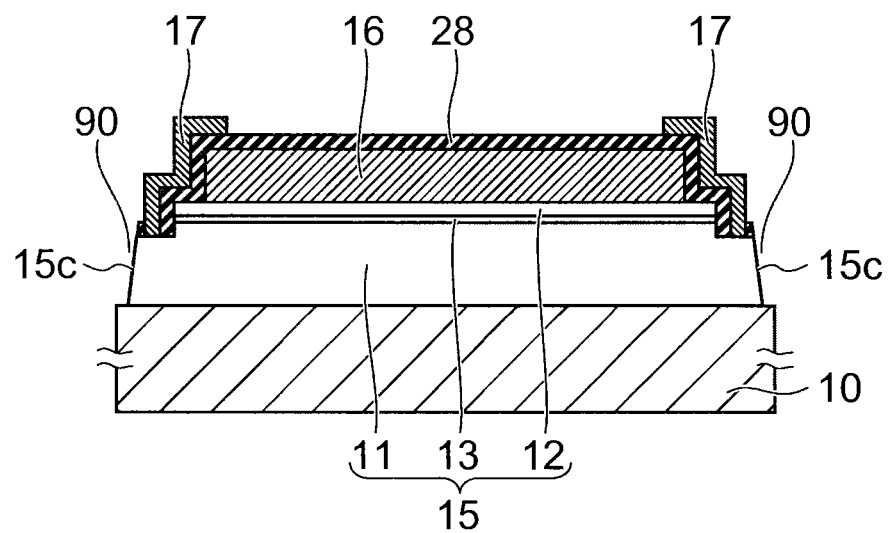

Subsequently, as shown in FIG. 21B, the trench 90 is made to reach the substrate 10 by selectively removing the first semiconductor layer 11 and the insulating film 28 at the surface of the first semiconductor layer 11 in the region where the first semiconductor layer 11 is exposed. The semiconductor layer 15 is divided into a plurality on the major surface of the substrate 10 by the trench 90. Also, the side surface 15c of the first semiconductor layer 11 is exposed.

The etching to divide the semiconductor layer 15 (the first semiconductor layer 11) is performed using a not-shown resist formed on the structural body of FIG. 21A as a mask. At this time, the insulating film 28 also is patterned using the resist as a mask. In other words, the insulating film 28 is used with the resist as the mask in the etching recited above. The first semiconductor layer 11 that is under the opening (the slit) selectively made in the resist and the insulating film 28 is etched.

The insulating film 28 is an inorganic insulating film, e.g., a silicon oxide film. For example, the etching rate of the insulating film (the silicon oxide film) 28 when etching the first semiconductor layer 11 which is a GaN layer is lower than the etching rate of the resist which is an organic film.

Therefore, in the etching, the widening of the opening made in the insulating film 28 can be less than the widening of the opening made in the resist. Accordingly, the dimensional controllability of the semiconductor layer 15 for the etching that uses the insulating film (the silicon oxide film) 28 in addition to the resist as a mask is superior to the dimensional controllability of the semiconductor layer 15 in the case where the first semiconductor layer 11 is etched using only the resist as a mask.

Figure 17A:
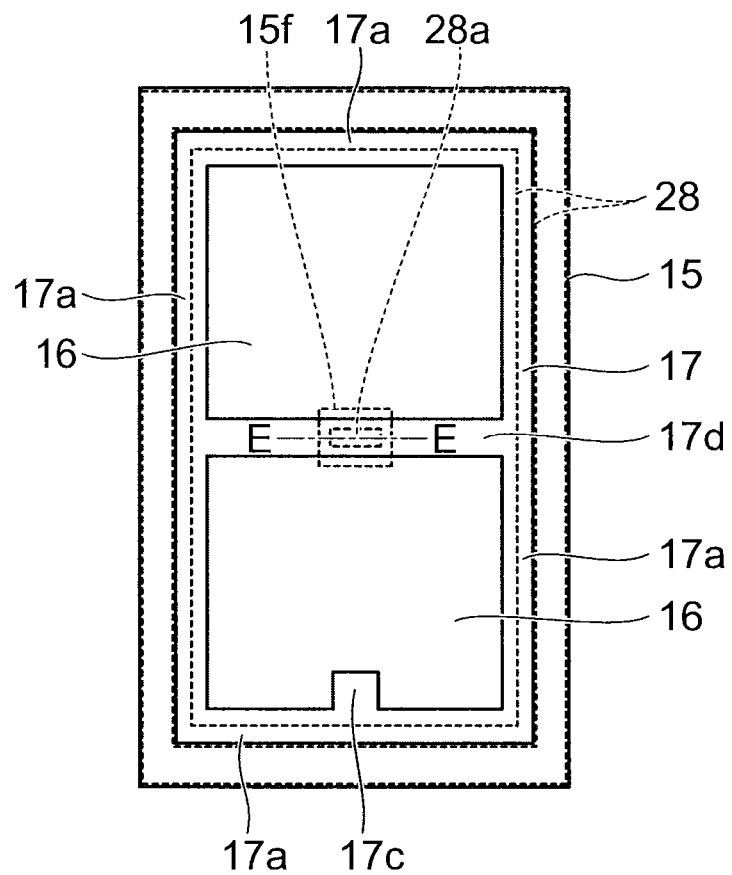
FIG. 17A is a schematic plan view of the semiconductor light emitting device of the embodiment.

FIG. 17A is a schematic plan view showing another specific example of the planar layout of the p-side electrode 16 and the n-side electrode 17 of the semiconductor light emitting device of the embodiment.

Figure 17B:
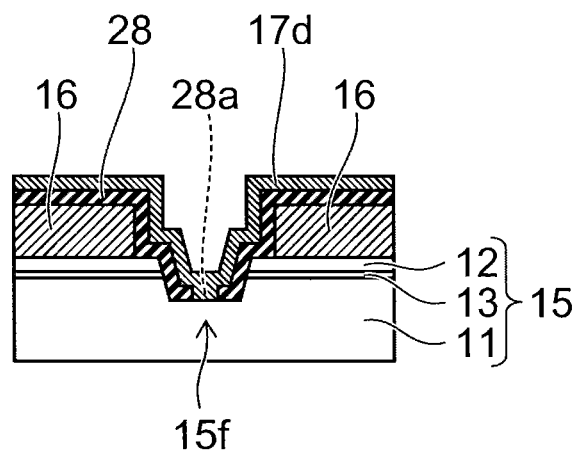
FIG. 17B is a E-E cross-sectional view of FIG. 17A.

FIG. 17B is an E-E cross-sectional view of FIG. 17A.

The layout shown in FIG. 17A differs from the layout shown in FIG. 4A described above in that the n-side electrode 17 further includes a straight portion 17d.

The straight portion 17d of the n-side electrode 17 extends in a linear configuration on the p-side electrode 16 with the insulating film 28 interposed. The p-side electrode 16 is formed in, for example, a planar pattern having a rectangular configuration. The straight portion 17d of the n-side electrode 17 extends to cross the p-side electrode 16 along the lateral direction of the p-side electrode 16 having the rectangular configuration.

The n-side electrode 17 includes four straight portions 17a formed along the four sides of the p-side electrode 16 having the rectangular configuration. The straight portion 17d is connected between the pair of the straight portions 17a extending in the longitudinal direction of the rectangular configuration. In other words, the straight portions 17a and the straight portion 17d are formed as one link.

The outer circumferential side portions of the four straight portions 17a contact the surface of the first semiconductor layer 11. As shown in FIG. 17B, a portion of the straight portion 17d also contacts the surface of the first semiconductor layer 11.

The p-side electrode 16 occupies the greater part of the surface of the second semiconductor layer 12. An opening is made in a portion of the p-side electrode 16; and the straight portion 17d of the n-side electrode 17 extends over the opening.

As shown in FIG. 17B, an n-side contact region 15f not including the p-side electrode 16 and the light emitting layer 13 is provided under the opening made in the p-side electrode 16. A portion of the straight portion 17d of the n-side electrode 17 in the n-side contact region 15f contacts the surface of the first semiconductor layer 11 via the opening 28a made in the insulating film 28.

In other words, the contact portion between the n-side electrode 17 and the first semiconductor layer 11 is disposed in a dot configuration inside the region where the p-side electrode is provided. The contact portion having the dot configuration is linked to the contact portion 17c for the n-side interconnect layer 22 via the straight portion 17d and the straight portions 17a. Accordingly, it is unnecessary to provide a contact to the n-side interconnect layer 22 for each contact portion; and the contact portion between the n-side interconnect layer 22 and the n-side electrode 17 can be provided in one location even in the case where the contact portion for the first semiconductor layer 11 is multiply disposed in a dot configuration. Thereby, the degrees of freedom increase for an electrode design that realizes both a light emitting region having a large surface area and a uniform distribution of the current.

Figure 18A:
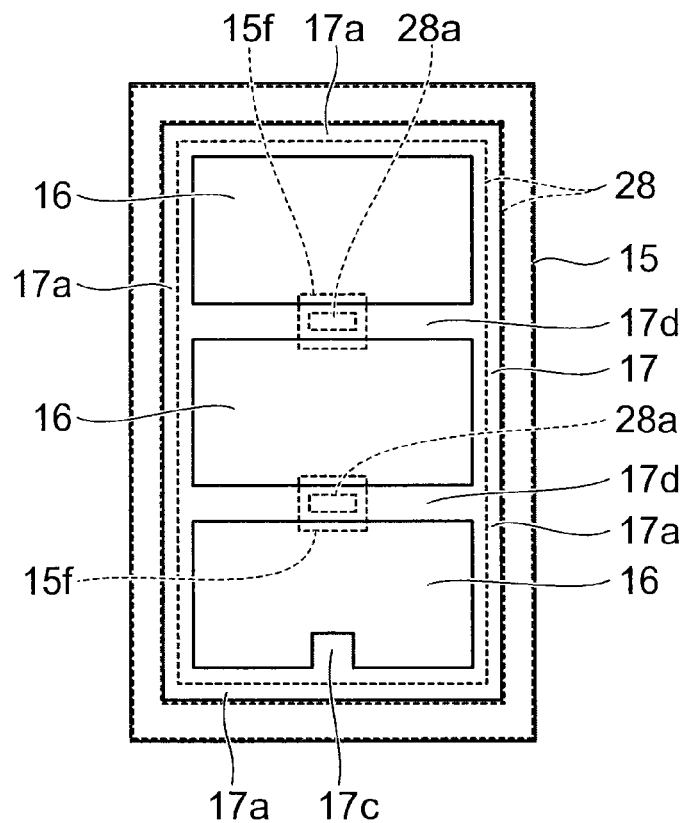
FIG. 18A to FIG. 19 are schematic plan views of the semiconductor light emitting device of the embodiment.

For example, as shown in FIG. 18A, the straight portion 17d and the contact portion between the straight portion 17d and the first semiconductor layer 11 may be multiply formed.

The contact portion for the first semiconductor layer 11 may be multiply formed for one straight portion 17d.

Figure 18B:
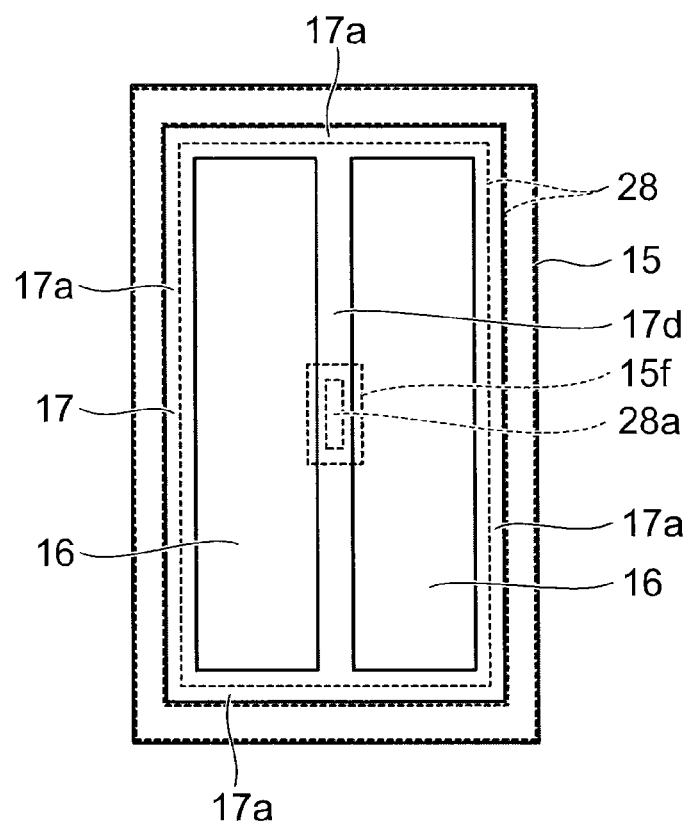

As shown in FIG. 18B, the straight portion 17d of the n-side electrode 17 may extend in the longitudinal direction of the p-side electrode 16 having the rectangular configuration. The straight portion 17d is connected between the pair of the straight portions 17a extending in the lateral direction of the p-side electrode 16 having the rectangular configuration.

Figure 19:
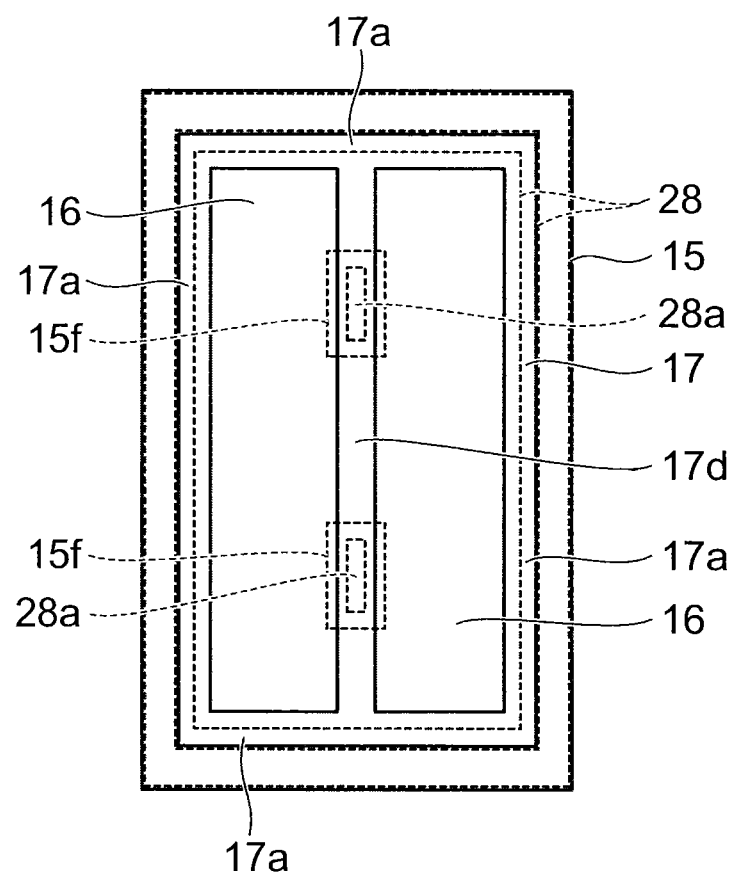

As shown in FIG. 19, the straight portion 17d that extends in the longitudinal direction of the p-side electrode 16 may contact the first semiconductor layer 11 at multiple locations.

Figure 22A:
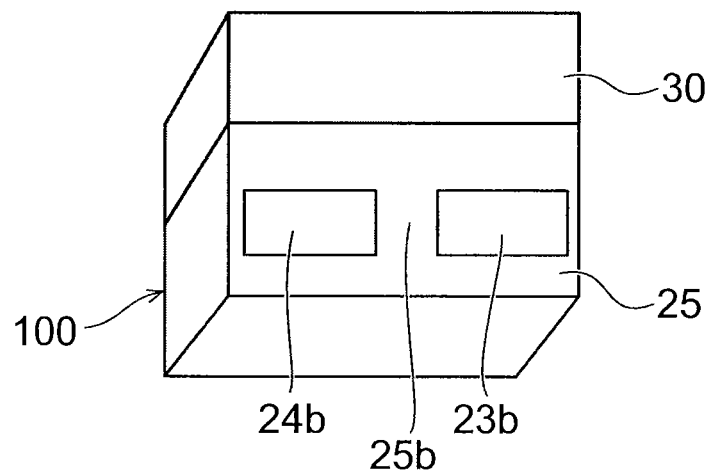
FIGS. 22A and 22B are schematic views of the semiconductor light emitting device of the embodiment.
Figure 22B:
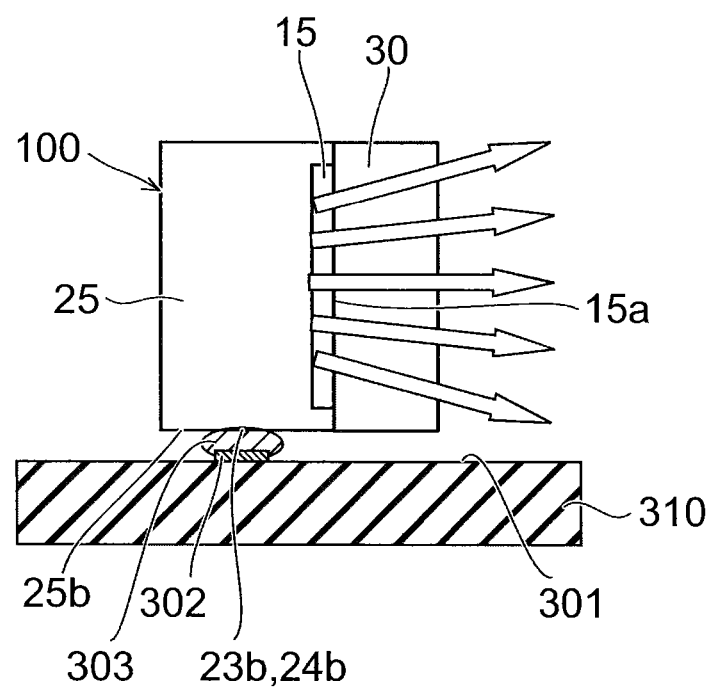

The embodiments described above also are applicable to a side-view type semiconductor light emitting device shown in FIGS. 22A and 22B.

In the semiconductor light emitting device shown in FIGS. 22A and 22B, the exposed surfaces of the metal pillars 23 and 24 that are exposed from the resin layer 25 to provide the connection to the outside differ from those of the embodiments recited above; but otherwise, the configuration is the same as those of the embodiments recited above.

FIG. 22A is a schematic perspective view of the side-view type semiconductor light emitting device.

FIG. 22B is a schematic cross-sectional view of a light emitting module having a configuration in which the side-view type semiconductor light emitting device is mounted on a mounting substrate 310.

The side surface of a portion of the p-type metal pillar 23 is exposed from the resin layer 25 at a third surface 25b that has a plane orientation that is different from the first surface 15a of the semiconductor layer 15 and the second surface 15b of the semiconductor layer 15 on the side opposite to the first surface 15a. The exposed surface functions as a p-side external terminal 23b for mounting to the external mounting substrate 310.

For example, the third surface 25b is a surface substantially perpendicular to the first surface 15a and the second surface 15b of the semiconductor layer 15. The resin layer 25 has, for example, four side surfaces having rectangular configurations; and one of the side surfaces is the third surface 25b.

The side surface of a portion of the n-side metal pillar 24 is exposed from the resin layer 25 at the same third surface 25b. The exposed surface functions as an n-side external terminal 24b for mounting to the external mounting substrate 310.

The portion of the p-type metal pillar 23 other than the p-side external terminal 23b that is exposed at the third surface 25b is covered with the resin layer 25. The portion of the n-side metal pillar 24 other than the n-side external terminal 24b that is exposed at the third surface 25b is covered with the resin layer 25.

As shown in FIG. 22B, the semiconductor light emitting device is mounted with an orientation in which the third surface 25b is oriented toward a mounting surface 301 of the substrate 310. The p-side external terminal 23b and the n-side external terminal 24b that are exposed at the third surface 25b are bonded via solder 303 respectively to pads 302 provided in the mounting surface 301. An interconnect pattern that provides a link to, for example, an external circuit is provided in the mounting surface 301 of the substrate 310; and the pads 302 are connected to the interconnect pattern.

The third surface 25b is substantially perpendicular to the first surface 15a which is the main emission surface of the light. Accordingly, the first surface 15a is oriented in a horizontal direction parallel to the mounting surface 301 or a direction tilted with respect to the mounting surface 301 with an orientation in which the third surface 25b is oriented toward the mounting surface 301 side. In other words, the side-view type semiconductor light emitting device emits the light in the horizontal direction parallel to the mounting surface 301 or a direction oblique to the mounting surface 301.

In the embodiments described above, the optical layer that is provided on the first surface 15a side of the semiconductor layer 15 is not limited to being a fluorescer layer and may be a scattering layer. Such a scattering layer includes scattering members (e.g., a titanium compound) having multiple particle configurations that scatter the light radiated by the light emitting layer 13, and a binder (e.g., a resin layer) that combines the multiple scattering members in a single body and transmits the light radiated by the light emitting layer 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
   a semiconductor layer including a first semiconductor layer, a second semiconductor layer, and a light emitting layer provided between the first semiconductor layer and the second semiconductor layer, the first semiconductor layer having a first surface, the light emitting layer and the second semiconductor layer being provided on a surface opposite to the first surface of the first semiconductor layer;
   a p-side electrode provided on the second semiconductor layer;
   an insulating film provided on an upper surface of an outer circumferential portion and a side surface of the p-side electrode, an upper surface of an outer circumferential portion and a side surface of the second semiconductor layer, a side surface of the light emitting layer, and a side surface of the first semiconductor layer;
   an n-side electrode including a first portion, a second portion, and a third portion, the first portion being in direct contact with the first semiconductor layer, the second portion provided on the upper surface of the outer circumferential portion of the second semiconductor layer with the insulating film interposed between the second portion and the upper surface of the outer circumferential portion of the second semiconductor layer, the third portion provided on the upper surface of the outer circumferential portion of the p-side electrode with the insulating film interposed between the third portion and the outer circumferential portion of the p-side electrode, the first portion, the second portion, and the third portion of the n-side electrode being continuously and integrally formed in a staircase pattern, and provided all around the outer circumferential portion of the p-side electrode and the outer circumferential portion of the second semiconductor layer;
   a p-side interconnect unit connected to the p-side electrode;
   an n-side interconnect unit connected to the n-side electrode; and
   a resin layer provided between the p-side interconnect unit and the n-side interconnect unit,
   the p-side interconnect unit includes a p-side interconnect layer and a p-side metal pillar, the p-side interconnect layer being connected to the p-side electrode, the p-side metal pillar being connected to the p-side interconnect layer and thicker than the p-side interconnect layer, and
   the n-side interconnect unit includes an n-side interconnect layer and an n-side metal pillar, the n-side interconnect layer being connected to the n-side electrode, the n-side metal pillar being connected to the n-side interconnect layer and thicker than the n-side interconnect layer.

2. The device according to claim 1, wherein an end portion of the p-side metal pillar and an end portion of the n-type metal pillar are externally connectable and arranged in the same surface.

3. The device according to claim 1, further comprising an optical layer provided on the first surface side, the optical layer being transmissive to light emitted from the light emitting layer.

4. The device according to claim 1, wherein the optical layer is a fluorescer layer including:
   a plurality of fluorescers configured to be excited by the light emitted from the light emitting layer to emit light of a wavelength different from a wavelength of the light emitted from the light emitting layer; and
   a binder configured to combine the plurality of fluorescers in a single body and transmit the light emitted from the light emitting layer and light emitted from the fluorescers.

5. The device according to claim 4, wherein
   the semiconductor layer does not include a substrate on the first surface side, and
   the fluorescer layer is provided on the first surface side without a substrate being interposed between the fluorescer layer and the semiconductor layer.

6. The device according to claim 5, further comprising a metal film covering a side surface of the semiconductor layer continuing from the first surface.

7. The device according to claim 1, wherein the resin layer is light-shielding to light emitted from the light emitting layer.

8. The device according to claim 1,
   wherein the n-side electrode includes an n-side contact portion
   another insulating film is provided on the n-side electrode and has an opening,
   the n-side contact portion is exposed in the opening, and
   the n-side interconnect unit is provided in the opening.

9. The device according to claim 1, wherein the third portion of the n-side electrode is provided on the second semiconductor layer with the p-side electrode interposed between the third portion and the second semiconductor layer.

* * * * *